US012232363B2

(12) United States Patent
Xu et al.

(10) Patent No.: US 12,232,363 B2
(45) Date of Patent: Feb. 18, 2025

(54) DISPLAY SUBSTRATE, MANUFACTURING METHOD THEREOF, AND DISPLAY APPARATUS

(71) Applicant: BOE Technology Group Co., Ltd., Beijing (CN)

(72) Inventors: Pan Xu, Beijing (CN); Yongqian Li, Beijing (CN); Guoying Wang, Beijing (CN); Dacheng Zhang, Beijing (CN); Chen Xu, Beijing (CN); Lang Liu, Beijing (CN); Xing Zhang, Beijing (CN); Ling Wang, Beijing (CN); Yicheng Lin, Beijing (CN); Ying Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 187 days.

(21) Appl. No.: 17/281,266

(22) PCT Filed: Aug. 19, 2020

(86) PCT No.: PCT/CN2020/109999
§ 371 (c)(1),
(2) Date: Mar. 30, 2021

(87) PCT Pub. No.: WO2021/082648
PCT Pub. Date: May 6, 2021

(65) Prior Publication Data
US 2022/0013612 A1    Jan. 13, 2022

(30) Foreign Application Priority Data

Oct. 29, 2019 (CN) .......................... 201911038817.7

(51) Int. Cl.
*H10K 59/121* (2023.01)
*H10K 59/126* (2023.01)
(Continued)

(52) U.S. Cl.
CPC ..... *H10K 59/1216* (2023.02); *H10K 59/1213* (2023.02); *H10K 59/126* (2023.02); *H10K 59/131* (2023.02); *H10K 59/1201* (2023.02)

(58) Field of Classification Search
CPC ............. H01L 27/3265; H01L 27/3262; H01L 27/3272; H01L 27/3276; H01L 2227/323;
(Continued)

(56) References Cited

U.S. PATENT DOCUMENTS 10,062,859 B2    8/2018   Chou et al.
2014/0175445 A1*  6/2014  Cai .................... G02F 1/136209
                                                              257/70
(Continued)

FOREIGN PATENT DOCUMENTS

CN    104733499 A    6/2015
CN    107403804 A  * 11/2017    ......... H01L 27/1222
(Continued)

OTHER PUBLICATIONS

International Search Report for PCT/CN2020/109999 Mailed Nov. 26, 2020.
European Search Report for 20870454.4 Mailed Nov. 15, 2022.
Office Action dated Jun. 17, 2024 for Japanese Patent Application No. 2021-563681 and English Translation.

*Primary Examiner* — Fernando L Toledo
*Assistant Examiner* — Jahae Kim
(74) *Attorney, Agent, or Firm* — Ling Wu; Stephen Yang; Ling and Yang Intellectual Property

(57) ABSTRACT

Provided are a display substrate, a manufacturing method thereof and a display apparatus. The display substrate includes multiple sub-pixels, wherein each sub-pixel includes a light-emitting region and a non-light-emitting region, and each sub-pixel is provided with a drive circuit; the drive circuit includes a storage capacitor and multiple transistors; for each sub-pixel, the multiple transistors are in
(Continued)

the non-light-emitting region, the storage capacitor is a transparent capacitor, and an orthographic projection of the storage capacitor on a base substrate coincides with the light-emitting region. A first electrode of the storage capacitor is disposed in a same layer as an active layer of the multiple transistors, but in a different layer from source and drain electrodes of the multiple transistors, and a second electrode of the storage capacitor is on a side of the first electrode close to the base substrate.

20 Claims, 18 Drawing Sheets

(51) Int. Cl.
*H10K 59/131* (2023.01)
*H10K 59/12* (2023.01)

(58) Field of Classification Search
CPC ....... H01L 27/322; H01L 21/77; H01L 21/82; H01L 27/3244; H10K 59/1216; H10K 59/1213; H10K 59/126; H10K 59/131; H10K 59/1201; H10K 59/38; H10K 59/12

See application file for complete search history.

(56) References Cited

U.S. PATENT DOCUMENTS

| | | |
|---|---|---|
| 2014/0346475 A1* | 11/2014 | Cho ...................... G09G 3/3225 438/4 |
| 2015/0179724 A1 | 6/2015 | Lee et al. |
| 2017/0271416 A1* | 9/2017 | Ryu ...................... H10K 50/844 |
| 2017/0317155 A1 | 11/2017 | Oh et al. |
| 2018/0122883 A1 | 5/2018 | Beak et al. |
| 2018/0151120 A1 | 5/2018 | Kim et al. |
| 2018/0182836 A1 | 6/2018 | Beak et al. |
| 2019/0131369 A1* | 5/2019 | Choi ...................... H10K 59/131 |
| 2019/0206972 A1 | 7/2019 | Park et al. |
| 2020/0119120 A1* | 4/2020 | Feng ...................... H10K 59/126 |
| 2020/0133083 A1* | 4/2020 | Chun ................ G02F 1/136286 |
| 2021/0056898 A1* | 2/2021 | Park ...................... G09G 3/3688 |
| 2022/0101792 A1* | 3/2022 | Park ...................... G09G 3/3688 |
| 2022/0102460 A1* | 3/2022 | Xu ...................... H10K 59/1213 |

FOREIGN PATENT DOCUMENTS

| | | |
|---|---|---|
| CN | 107452766 A | 12/2017 |
| CN | 108461529 A | 8/2018 |
| CN | 109036291 A | 12/2018 |
| EP | 3331022 A1 | 6/2018 |
| JP | 2015179248 A | 10/2015 |
| JP | 2021523512 A | 9/2021 |
| KR | 20180031978 A * | 9/2016 |

* cited by examiner

DISPLAY SUBSTRATE, MANUFACTURING METHOD THEREOF, AND DISPLAY APPARATUS

CROSS-REFERENCE TO RELATED APPLICATION

The present application is a U.S. National Phase Entry of International Application PCT/CN2020/109999 having an international filing date of Aug. 19, 2020 and claims the priority of Chinese patent application No. 201911038817.7, filed to the CNIPA on Oct. 29, 2019 and entitled "Display Substrate, Manufacturing Method Thereof, and Display Apparatus", the content of which should be construed as being incorporated herein by reference.

TECHNICAL FIELD

The present disclosure relates to the field of display technology, and in particular relates to a display substrate and a method for manufacturing the display substrate, and a display apparatus.

BACKGROUND

An Organic Light-Emitting apparatus (abbreviated as OLED) display substrate is a display technology different from conventional Liquid Crystal Display (abbreviated as LCD), and has advantages such as active light emission, good temperature characteristics, low power consumption, fast response, flexibility, ultra-thinness and low costs. It has become one of the important discoveries of a new generation of display apparatuses and has been brought into greater focus.

OLED display substrates may be divided into three types according to light emitting directions: bottom emission OLED, top emission OLED and double-sided emission OLED. Among them, the bottom emission OLED means that light is emitted from an OLED component towards the substrate. However, the bottom emission OLED display substrate is limited by the pixel opening area, making an area occupied by each sub-pixel larger, which further leads to a smaller number of Pixels Per Inch (abbreviated as PPI) in the bottom emission OLED display substrate, thus a high PPI cannot be reached.

SUMMARY

The following is a summary of the subject matter described in detail in the present disclosure. This summary is not intended to limit the protection scope of the claims. On one hand, the present disclosure provides a display substrate, which includes a base substrate and multiple sub-pixels disposed on the base substrate, wherein each sub-pixel includes a light-emitting region and a non-light-emitting region, and a drive circuit is disposed in each sub-pixel. The drive circuit includes a storage capacitor and multiple transistors including a switch transistor, a drive transistor and a sense transistor.

For each sub-pixel, the multiple transistors are in the non-light-emitting region, the storage capacitor is a transparent capacitor, and an orthographic projection of the storage capacitor on the base substrate coincides with the light-emitting region. A first electrode of the storage capacitor is disposed in a same layer as an active layer of the multiple transistors and in a different layer from source and drain electrodes of the multiple transistors, and a second electrode of the storage capacitor is located on a side of the first electrode close to the substrate.

A first electrode of the drive transistor is connected to the second electrode of the storage capacitor through an active layer of the drive transistor, and a first electrode of the sense transistor is connected to the second electrode of the storage capacitor through an active layer of the sense transistor.

In an exemplary embodiment, for each sub-pixel, an active layer of each transistor includes a channel region, a first conductive region and a second conductive region.

The first conductive region and the second conductive region are respectively disposed on two sides of the corresponding channel region, a second electrode of each of the multiple transistors is connected to the first conductive region, and a first electrode of each of the multiple transistors is connected to the second conductive region.

A second conductive region of the drive transistor is connected to the second electrode of the storage capacitor, and a second conductive region of the sense transistor is connected to the second electrode of the storage capacitor.

In an exemplary embodiment, the display substrate further includes a buffer layer disposed on a side of the active layer of the multiple transistors close to the base substrate, wherein the buffer layer includes a first via hole and a second via hole that expose the second electrode of the storage capacitor.

The second conductive region of the drive transistor is connected to the second electrode of the storage capacitor through the first via hole, and the second conductive region of the sense transistor is connected to the second electrode of the storage capacitor through the second via hole.

In an exemplary embodiment, the drive transistor further includes a light shield layer disposed on a side of the buffer layer close to the base substrate.

The second electrode of the storage capacitor is disposed on the side of the buffer layer of close to the base substrate, an orthographic projection of the second electrode on the base substrate covers an orthographic projection of the light shield layer on the base substrate, and a surface of the light shield layer close to the second electrode is completely in contact with the second electrode.

The light shield layer is disposed on a side of the second electrode close to the base substrate, or the second electrode is disposed on a side of the light shield layer close to the base substrate.

In an exemplary embodiment, the display substrate further includes multiple rows of gate lines and multiple columns of data lines disposed on the base substrate; wherein each sub-pixel is defined by intersection of gate lines and data lines, and the multiple sub-pixels respectively correspond to the multiple rows of gate lines and the multiple columns of data lines one by one; the multiple rows of gate lines include a first gate line and a second gate line.

The first gate line and the second gate line are disposed in a same layer as gate electrodes of the transistors, and the multiple columns of data lines are disposed in a same layer as the source and drain electrodes of the multiple transistors.

In an exemplary embodiment, for each sub-pixel, the first electrode of the storage capacitor is respectively connected to a first electrode of the switch transistor and a gate electrode of the drive transistor.

A gate electrode of the switch transistor is connected to the first gate line among the gate lines corresponding to the sub-pixel; a second electrode of the switch transistor is connected to a data line corresponding to the sub-pixel, and a gate electrode of the sense transistor is connected to the second gate line among the gate lines corresponding to the sub-pixel.

In an exemplary embodiment, for each sub-pixel, the non-light-emitting region includes a first non-light-emitting region and a second non-light-emitting region, which are on two sides of the light-emitting region and disposed along an extending direction of the multiple columns of data lines.

The sense transistor and the second gate line are both in the first non-light-emitting region, and the switch transistor, the drive transistor and the first gate line are all in the second non-light-emitting region.

In an exemplary embodiment, the display substrate further includes power supply lines and sense lines disposed in a same layer as the multiple columns of data lines, and each pixel includes four sub-pixels disposed along an extending direction of the multiple rows of gate lines, and each pixel corresponds to two columns of power supply lines and one column of sense line.

For each pixel, a sense line corresponding to the pixel is between a second sub-pixel and a third sub-pixel, one column of power supply line corresponding to the pixel is on a side of a first sub-pixel away from the second sub-pixel, and another column of power supply lines corresponding to the pixel is on a side of a fourth sub-pixel away from the third sub-pixel.

A data line corresponding to the first sub-pixel is on a side of the first sub-pixel close to the second sub-pixel; a data line corresponding to the second sub-pixel is on a side of the second sub-pixel close to the first sub-pixel; a data line corresponding to the third sub-pixel is on a side of the third sub-pixel close to the fourth sub-pixel, and a data line corresponding to the fourth sub-pixel is on a side of the fourth sub-pixel close to the third sub-pixel.

The display substrate further includes power supply connection lines disposed in the same layer as the gate electrodes of the multiple transistors and sensing connection lines disposed in a same layer as the light shield layers; each pixel corresponds to two power supply connection lines disposed along the extending direction of the gate line and two sensing connection lines disposed along the extending direction of the gate line; the power supply connection lines respectively correspond to power supply lines; the power supply connection lines are connected to the corresponding power supply lines; the two sensing connection lines are connected to the sense lines.

A second electrode of a drive transistor of the second sub-pixel is connected to one of the power supply connection lines.

A second electrode of a drive transistor of the third sub-pixel is connected to another one of the power supply connection lines.

A second electrode of a sense transistor of the first sub-pixel is connected to one of the sensing connection lines through an active layer of the sense transistor.

A second electrode of a sense transistor of the fourth sub-pixel is connected to another one of the sensing connection lines through the active layer of the sense transistor.

In an exemplary embodiment, the buffer layer is further provided with a third via hole which exposes a sensing connection line.

A first conductive region of the sense transistor is connected to the sensing connection line through the third via hole.

In an exemplary embodiment, the display substrate further includes gate insulating layers disposed between the gate electrodes of the multiple transistors and the active layer of the multiple transistors and interlayer insulating layers disposed between the source and drain electrodes of the multiple transistors and the active layer of the transistors;

wherein an orthographic projection of the gate insulating layers on the base substrate coincides with an orthographic projection of the gate electrodes of the multiple transistors on the base substrate.

In an exemplary embodiment, an interlayer insulating layer is provided with a via hole which is in the second non-light-emitting region and exposes the gate electrode of the drive transistor and the first electrode of the storage capacitor at the same time; the first electrode of the switch transistor is connected to the gate electrode of the drive transistor and the first electrode of the storage capacitor through the via hole.

In an exemplary embodiment, the first electrode of the storage capacitor is made of a same manufacturing material as a conductive region, and the conductive region includes the first conductive region or the second conductive region.

The manufacturing material of the first electrode of the storage capacitor includes transparent metal oxide, and a manufacturing material of the second electrode of the storage capacitor includes a transparent conductive material.

In an exemplary embodiment, each sub-pixel is further provided with a light emitting element and a filter with a same color as the sub-pixel; the light emitting element includes an anode, an organic light-emitting layer and a cathode which are sequentially disposed, wherein the anode is connected to the first electrode of the sense transistor, the anode is a transmission electrode and the cathode is a reflection electrode.

An orthographic projection of the light emitting element on the base substrate coincides with the light-emitting region, and the filter is in the light-emitting region and disposed on a side of the light emitting element close to the base substrate. An orthographic projection of the anode on the base substrate covers an orthographic projection of the filter on the base substrate.

In an exemplary embodiment, the display substrate further includes a passivation layer and a flat layer disposed on a side of the source and drain electrodes of the multiple transistors away from the base substrate.

The passivation layer is disposed on a side of the filter close to the base substrate, and the flat layer is disposed between the light emitting element and the filter; the passivation layer is provided with a fourth via hole exposing the first electrode of the sense transistor, and the flat layer is provided with a fifth via hole exposing the fourth via hole.

The anode is connected to the first electrode of the sense transistor through the fourth via hole and the fifth via hole.

An orthographic projection of the fifth via hole on the base substrate does not completely coincide with an orthographic projection of the second via hole on the base substrate.

In another aspect, the present disclosure provides a display apparatus including any of the above display substrates.

In still another aspect, the present disclosure provides a method for manufacturing a display substrate, which is used for manufacturing any of the above display substrates. The method includes:

providing a base substrate; and forming multiple sub-pixels on the base substrate, wherein each sub-pixel includes a light-emitting region and a non-light-emitting region, and each sub-pixel is provided therein with a drive circuit; the drive circuit includes a storage capacitor and multiple transistors;

the multiple transistors includes a switch transistor, a drive transistor and a sense transistor.

For each sub-pixel, the multiple transistors are in the non-light-emitting region, the storage capacitor is a transparent capacitor, and an orthographic projection of the storage capacitor on the base substrate coincides with the light-emitting region. A first electrode of the storage capacitor is disposed in a same layer as an active layer of the multiple transistors and in a different layer from source and drain electrodes of the multiple transistors, and a second electrode of the storage capacitor is on a side of the first electrode of the storage capacitor close to the base substrate.

A first electrode of the drive transistor is connected to the second electrode of the storage capacitor through an active layer of the drive transistor, and a first electrode of the sense transistor is connected to the second electrode through an active layer of the sense transistor.

In an exemplary embodiment, the display substrate further includes a gate line, a data line, a power supply line and a sense line, wherein the gate line includes a first gate line and a second gate line, and the step of forming the multiple sub-pixels on the base substrate includes:

forming a light shield layer and the second electrode of the storage capacitor on the base substrate;

forming the active layer of the multiple transistors and the first electrode of the storage capacitor on the light shield layer and the second electrode;

forming gate electrodes of the multiple transistors, the first gate line and the second gate line on the active layer of the multiple transistors and the first electrodes of the storage capacitor;

forming the data line, the power supply line, the sense line and the source and drain electrodes of the multiple transistors on the gate electrodes of the multiple transistors, the first gate line and the second gate line; and sequentially forming the filter and the light emitting element on the data line, the power supply line, the sense line and the source and drain electrodes of the multiple transistors.

In an exemplary embodiment, the step of forming the light shield layer and the second electrode of the storage capacitor on the base substrate includes:

sequentially forming the light shield layer and the second electrode of the storage capacitor on the base substrate, or sequentially forming the second electrode of the storage capacitor and the light shield layer on the base substrate, or simultaneously forming the second electrode of the storage capacitor and the light shield layer on the base substrate.

In an exemplary embodiment, the step of simultaneously forming the second electrode of the storage capacitor and the light shield layer on the base substrate includes:

sequentially depositing a light shielding thin film and a transparent conductive thin film on the base substrate; and simultaneously forming the second electrode of the storage capacitor and the light shield layer using a halftone mask.

In an exemplary embodiment, the step of forming the active layer of the multiple transistors and the first electrode on the light shield layer and the second electrode includes:

forming a buffer layer including a first via hole, a second via hole and a third via hole on the light shield layer and the second electrode; the first via hole and the second via hole exposing the second electrode, and the third via hole exposing a sensing connection line; and forming the active layer of the multiple transistors and the first electrode of the storage capacitor on the buffer layer using a same manufacturing process.

The step of sequentially forming the filter and the light emitting element on the data line, the power supply line, the sense line and the source and drain electrodes of the multiple transistors includes:

forming a passivation layer including a fourth via hole on the data line, the power supply line, the sense line and the source and drain electrodes of the multiple transistors; the fourth via hole exposing the first electrode of the sense transistor;

sequentially forming the filter and a flat layer including a fifth via hole on the passivation layer; the fifth via hole exposing the seventh via hole; and forming the light emitting element on the flat layer. Other features and advantages of the present application will be set forth in the following description, and in part will become apparent from the description, or may be learned by practice of the present application. Other advantages of the present application may be realized and obtained through the solution described in the description, claims and accompanying drawings.

Other aspects will become apparent upon reading and understanding accompanying drawings and the detailed description.

BRIEF DESCRIPTION OF DRAWINGS

The accompanying drawings are used to provide an understanding of the technical solution of the present application and form a part of the description. Together with the embodiments of the application, the accompanying drawings are used to explain the technical solution of the present application and do not constitute a limitation on the technical solution of the present application.

DETAILED DESCRIPTION

Figure 1:
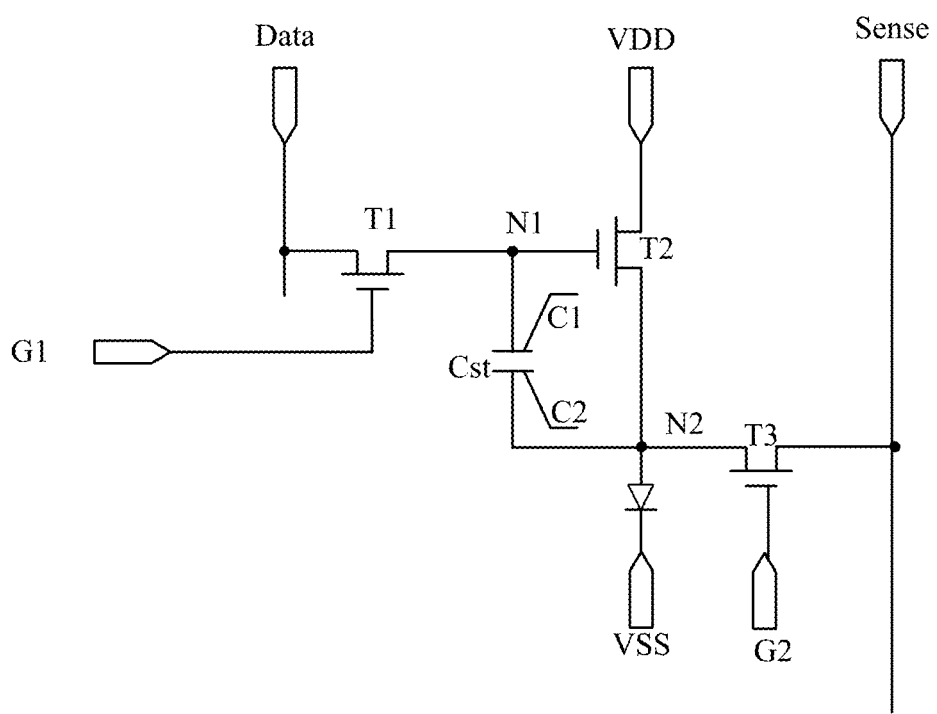
FIG. 1 is an equivalent circuit diagram of a pixel drive circuit.

Multiple embodiments are described in the present disclosure, but the description is exemplary rather than restrictive, and it is apparent to those of ordinary skills in the art that there may be more embodiments and implementation solutions within the scope of the embodiments described in the present disclosure. Although many possible combinations of features are shown in the accompanying drawings and discussed in the Detailed Description, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any conventional features or elements to form unique technical solutions defined by the claims. Any feature or element of any embodiment may also be combined with features or elements from another technical solution to form another unique technical solution defined by the claims. Therefore, it should be understood that any of the features shown and/or discussed in the present disclosure may be implemented individually or in any suitable combination. Therefore, the embodiments are not otherwise limited except in accordance with the appended claims and equivalents thereof. In addition, various modifications and changes may be made within the protection scope of the appended claims.

In addition, when describing representative embodiments, the specification may have presented a method and/or a process as a specific sequence of steps. However, to the extent that the method or process does not depend on the specific order of steps described in the present disclosure, the method or process should not be limited to the specific order of steps described. As those of ordinary skills in the art will understand, other orders of steps are also possible. Therefore, the specific order of steps set forth in the specification should not be interpreted as limiting the claims. In addition, the claims for the method and/or process should not be limited to performing their steps in the written order, and those of skilled in the art may readily understand that these orders may vary and still be kept within the spirit and scope of the embodiments of the present disclosure.

Unless otherwise defined, technical terms or scientific terms used in the embodiments of the present disclosure shall have common meanings as construed by those of ordinary skills in the art to which the present disclosure pertains. The words "first", "second" and the like used in the embodiments of the present disclosure do not represent any order, quantity or importance, but are merely used to distinguish among different components. Similar words such as "including" or "comprising" mean that elements or articles appearing before the word cover elements or articles listed after the word and their equivalents, without excluding other elements or articles. Similar words such as "connect" or "link" are not limited to physical or mechanical connections, but may include electrical connections, whether direct or indirect. "Up", "down", "left", "right", etc. are only used to represent a relative position relation that may change accordingly after an absolute position of an object being described is changed.

In this embodiment, the display substrate includes multiple sub-pixels, wherein each sub-pixel includes a drive circuit and a light emitting element. FIG. 1 is an equivalent circuit diagram of a drive circuit, illustrating a 3T1C drive circuit. As shown in FIG. 1, the drive circuit is electrically connected to a first gate line G1, a sense line Sense, a power supply line VDD, a data line Data and a second gate line G2, and the drive circuit includes a switch transistor T1, a drive transistor T2, a sense transistor T3 and a storage capacitor Cst.

In an exemplary embodiment, in the drive circuit, a gate electrode of the switch transistor T1 is connected to the first gate line G1, a first electrode of the switch transistor T1 is connected to a node N1, and a second electrode of the switch transistor T1 is connected to the data line Data. A gate electrode of drive transistor T2 is connected to the node N1, a first electrode of the drive transistor T2 is connected to a node N2, and a second electrode of the drive transistor T2 is connected to the power supply line VDD. A gate electrode of the sense transistor T3 is connected to the second gate line G2, a first electrode of the sense transistor T3 is connected to the node N2, a second electrode of the sense transistor T3 is connected to the sense line Sense. An anode of a light emitting element OLED is connected to the node N2, a cathode of the light emitting element OLED is connected to the low power supply line VSS, and the light emitting element OLED is configured to emit light with corresponding brightness in response to a current of the first electrode of the drive transistor. When the drive circuit turns on the switch transistor T1 through the first gate line G1, a data voltage Vdata provided by the data line Data is stored in the storage capacitor Cst via the switch transistor T1, thereby controlling the drive transistor T2 to generate current and to further drive the organic light emitting diode (OLED) to emit light. In addition, the sense transistor T3 may extract a threshold voltage Vth and a mobility of the drive transistor T2 in response to sensing timing, and the storage capacitor Cst is configured to maintain a voltage difference between the node N1 and the node N2 in one frame of a light emission period.

Herein, the first electrode refers to a source electrode and the second electrode refers to a drain electrode.

Figure 2A:
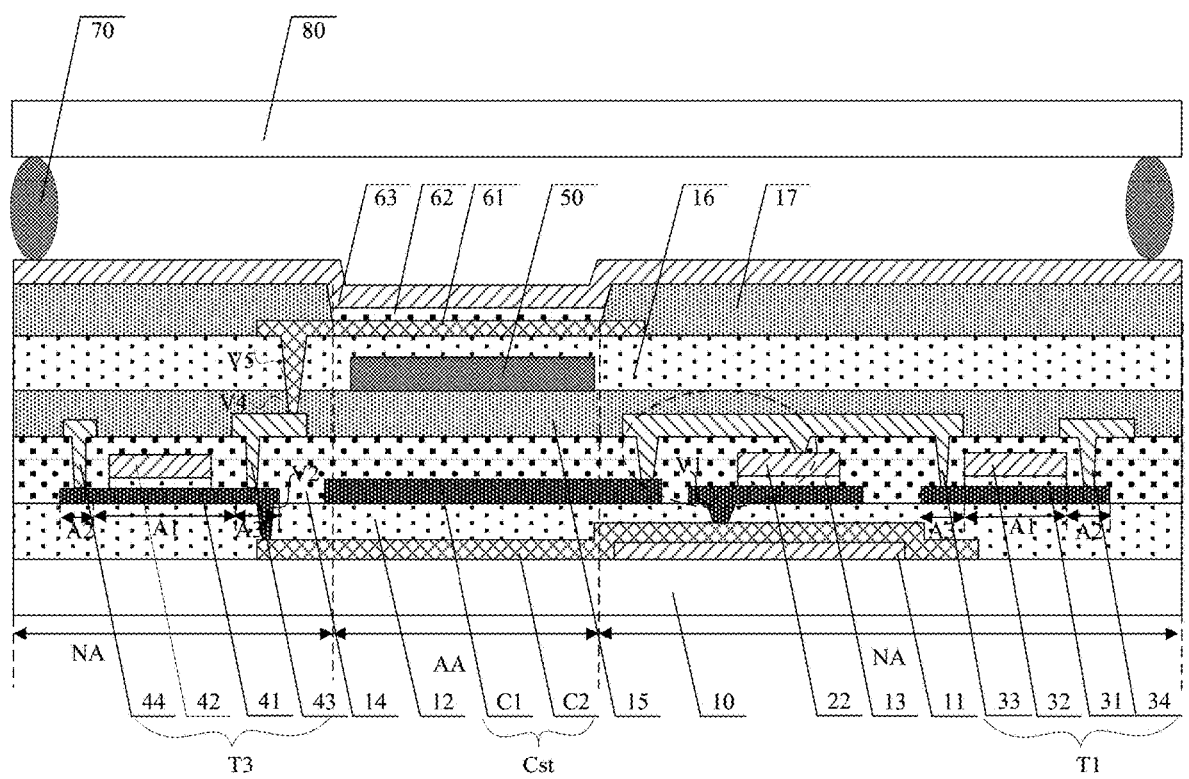
FIG. 2A is a section view of a display substrate according to an embodiment of the present disclosure.
Figure 2B:
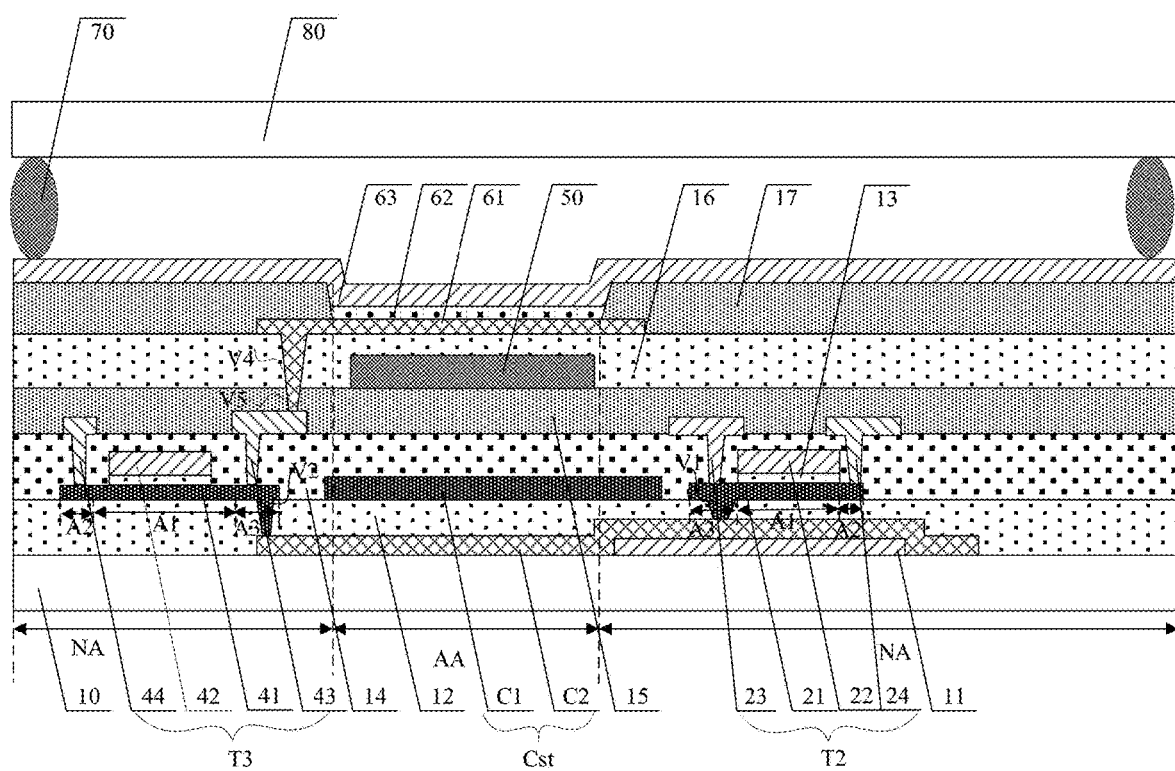
FIG. 2B is another section view of a display substrate according to an embodiment of the present disclosure.

Some embodiments of the present disclosure provide a display substrate. FIG. 2A is a side view of a display substrate according to an embodiment of the present disclosure and FIG. 2B is another side view of a display substrate according to an embodiment of the present disclosure. As shown in FIG. 2A and FIG. 2B, the display substrate according to this embodiment of the present disclosure includes a base substrate 10 and multiple sub-pixels disposed on the base substrate 10, wherein each sub-pixel includes a light-emitting region AA and a non-light-emitting region NA, and each sub-pixel is provided therein with a drive circuit. The drive circuit includes a storage capacitor Cst and multiple transistors, and the multiple transistors include a switch transistor T1, a drive transistor T2 and a sense transistor T3.

For each sub-pixel, the multiple transistors are located in the non-light-emitting region NA, the storage capacitor Cst is a transparent capacitor, and an orthographic projection of the storage capacitor Cst on the base substrate 10 coincides with the light-emitting region AA. A first electrode C1 of the storage capacitor Cst is disposed in a same layer as an active layer of the multiple transistors, but in a different layer from the source and drain electrodes of the multiple transistors. A second electrode C2 of the storage capacitor Cst is located on a side of the first electrode C1 close to the base substrate 10. A first electrode 23 of the drive transistor T2 is connected to the second electrode C2 through an active layer 21 of the drive transistor T2, and a first electrode 43 of the sense transistor T3 is connected to the second electrode C2 through an active layer 41 of the sense transistor T3.

In an exemplary embodiment, the sub-pixels are disposed on the substrate in an array. A sub-pixel is taken as an example in FIG. 2A and FIG. 2B, both of FIG. 2A and FIG. 2B are side views from different perspectives.

In an exemplary embodiment, the base substrate 10 may be a rigid substrate or a flexible substrate, wherein the rigid substrate may be, but is not limited to, one or more of glass and metal foils; and the flexible substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIG. 2A and FIG. 2B, the switch transistor T1 in the embodiment of the present disclosure includes an active layer 31, a gate electrode 32, a first electrode 33 and a second electrode 34 which are sequentially disposed on the base substrate 10. The drive transistor T2 includes an active layer 21, a gate electrode 22, a first electrode 23 and a second electrode 24 which are sequentially disposed on the base substrate 10. The sense transistor T3 includes an active layer 41, a gate electrode 42, a first electrode 43 and a second electrode 44 which are sequentially disposed on the base substrate 10.

In an exemplary embodiment, the display substrate according to the embodiment of the present disclosure is a bottom emission OLED display substrate.

The storage capacitor in the embodiment of the present disclosure is a transparent capacitor, which does not affect light emitting effect of the display substrate and may ensure smooth light emitting.

In an exemplary embodiment, each sub-pixel is further provided with a light emitting element, which may be an OLED.

The display substrate according to the embodiment of the disclosure includes a base substrate and multiples sub-pixels disposed on the substrate, wherein each sub-pixel includes a light-emitting region and a non-light-emitting region, and each sub-pixel is provided therein with a drive circuit. The drive circuit includes a storage capacitor and multiple transistors, wherein the multiple transistors include a switch transistor, a drive transistor and a sense transistor. For each sub-pixel, the multiple transistors are in the non-light-emitting region, the storage capacitor is a transparent capacitor, and an orthographic projection of the storage capacitor on the base substrate coincides with the light-emitting region. A first electrode of the storage capacitor is disposed in a same layer as an active layer of the multiple transistors, but in a different layer from the source and drain electrodes of the multiple transistors, and a second electrode of the storage capacitor is on a side of the first electrode close to the substrate. A first electrode of the drive transistor is connected to the second electrode of the storage capacitor through an active layer of the drive transistor, and a first electrode of the sense transistor is connected to the second electrode of the storage capacitor through an active layer of the sense transistor. By disposing an overlapping region between the light-emitting region and an orthographic projection of the transparent storage capacitor on the base substrate and by partially connecting the active layer of the transistor to the first electrode of the transistor and the second electrode of the storage capacitor, the present disclosure not only reduces thickness and size of the via hole connected to the first electrode of the transistor and the second electrode in each sub-pixel, but also greatly reduces an area ratio of the storage capacitor in the non-light-emitting region while ensuring the aperture ratio and further the area occupied by each sub-pixel can be decreased and a high PPI of the display substrate can be achieved.

In an exemplary embodiment, as shown in FIG. 2A and FIG. 2B, for each sub-pixel, an active layer of each transistor includes a channel region A1, a first conductive region A2 and a second conductive region A3.

The first conductive region A2 and the second conductive region A3 are respectively disposed on two sides of the channel region A1, wherein a second electrode of the transistor is connected to the first conductive region A2, and a first electrode of the transistor is connected to the second conductive region A3. The second conductive region A3 of the drive transistor T2 is connected to the second electrode C2, and the second conductive region A3 of the sense transistor T3 is connected to the second electrode C2.

In an exemplary embodiment, for each transistor, there is an overlapping region between an orthographic projection of an active layer of the transistor on the base substrate and an orthographic projection of a gate electrode of the transistor on the base substrate.

Figure 3:
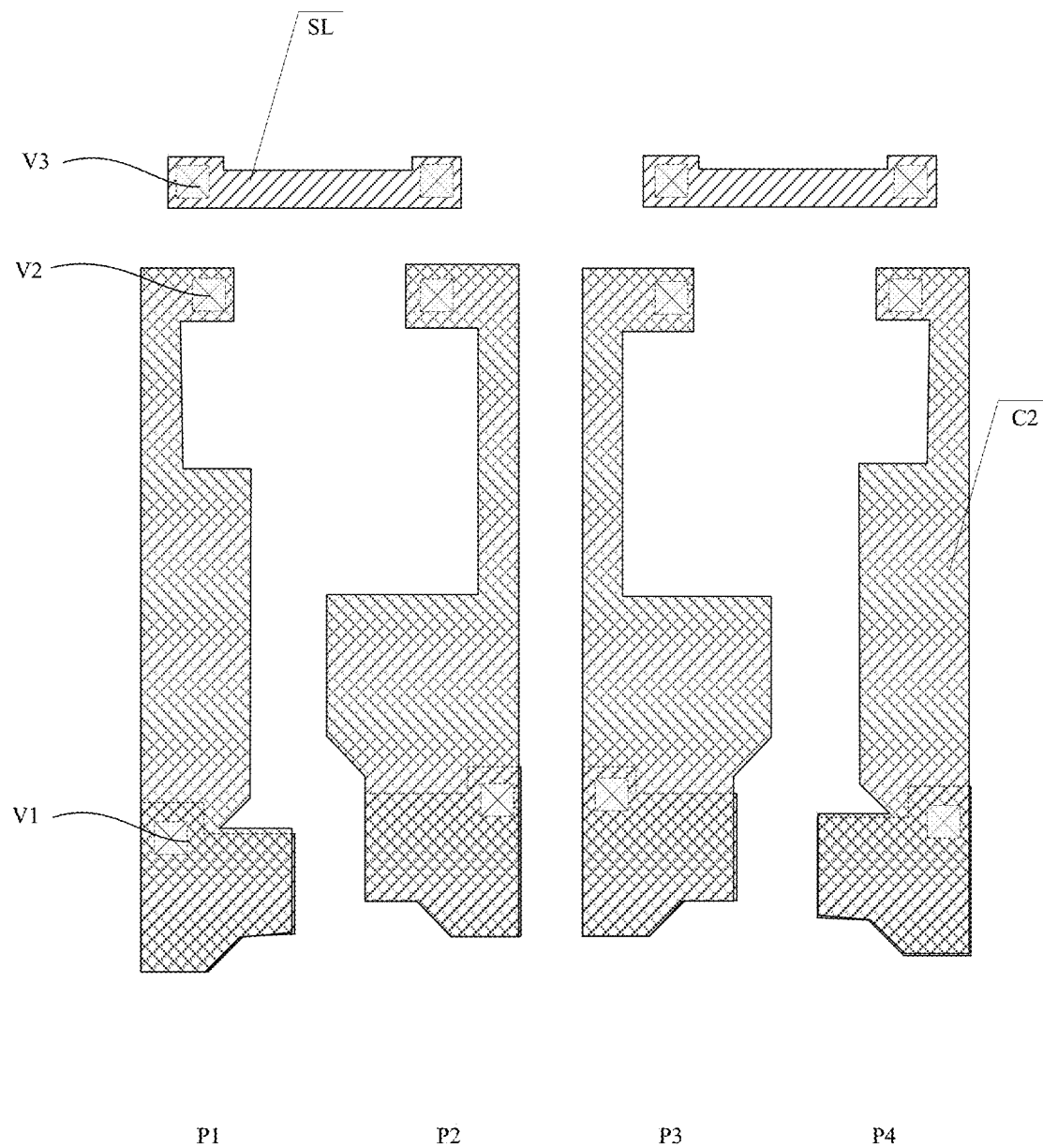
FIG. 3 is a top view of a display substrate according to an embodiment of the present disclosure.

In an exemplary embodiment, FIG. 3 is a top view of the display substrate according to the embodiment of the present disclosure. As shown in FIG. 2A to 2B and FIG. 3, the display substrate according to the embodiment of the present disclosure further includes a buffer layer 12 disposed on a side of an active layer of the transistor close to the base substrate 10, wherein the buffer layer 12 includes a first via hole V1 and a second via hole V2 exposing the second electrode C2.

In an exemplary embodiment, the second conductive region A3 of the drive transistor T2 is connected to the second electrode C2 through the first via hole V1, and the second conductive region A3 of the sense transistor T3 is connected to the second electrode C2 through the second via hole V2.

In an exemplary embodiment, as shown in FIG. 2A and FIG. 2B, the drive transistor T2 according to the embodiment of the present disclosure further includes a light shield layer 11 disposed on a side of the buffer layer 12 close to the base substrate 10.

In an exemplary embodiment, the second electrode C2 is disposed on the side of the buffer layer 12 close to the base substrate 10, and an orthographic projection of the second electrode C2 on the base substrate 10 covers an orthographic projection of the light shield layer 11 on the base substrate 10, and a surface of the light shield layer 11 close to the second electrode C2 is completely in contact with the second electrode C2.

In an exemplary embodiment, the light shield layer 11 is disposed on a side of the second electrode C2 close to the base substrate 10, or the second electrode C2 is disposed on a side of the light shield layer 11 close to the base substrate 10, wherein the light shield layer 11 disposed on the side of the second electrode C2 close to the base substrate 10 is taken as an example in FIG. 2. When the second electrode C2 is disposed on the side of the light shield layer 11 close to the base substrate 10, the second conductive region A2 of the drive transistor T2 and the second conductive region A2 of the sense transistor T3 are connected to the second electrode C2 through the light shield layer 11.

According to the embodiment of the present disclosure, the surface of the light shield layer 11 close to the second electrode C2 is completely in contact with the second electrode C2 to avoid disposing an insulating layer between the light shield layer and the second electrode, which not only reduces the number of layers and thickness of the display substrate, but also reduces the number of use of masks, simplifies the manufacturing process and reduces manufacturing costs of the display substrate.

In an exemplary embodiment, the orthographic projection of the light shield layer 11 on the base substrate 10 covers an orthographic projection of the channel region A1 of the active layer 31 of the drive transistor T2 on the base substrate 10.

In an exemplary embodiment, the light shield layer 11 is made of metal, such as silver, aluminum, etc, which is not limited in the embodiments of the present disclosure.

Figure 4:
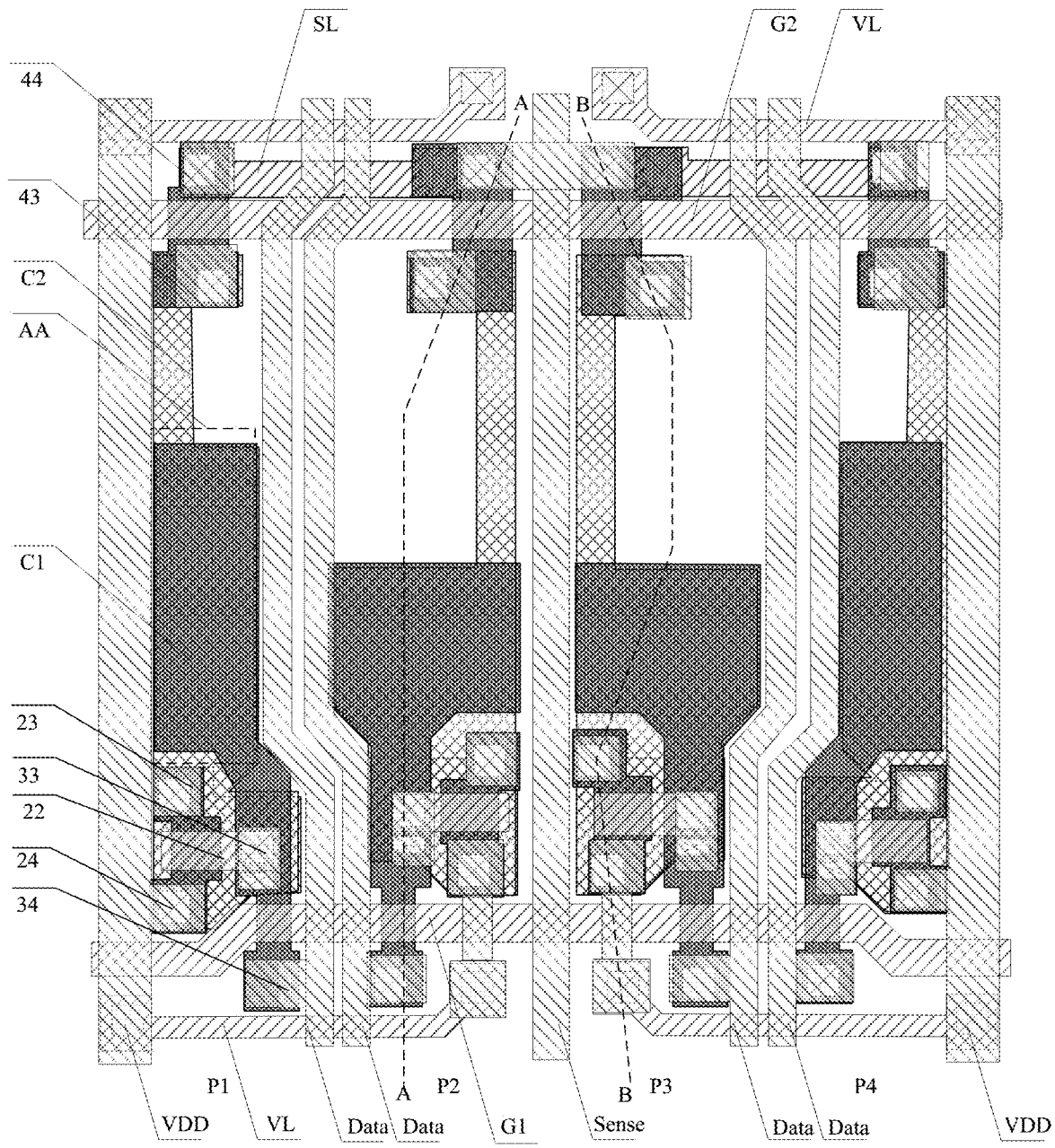
FIG. 4 is another top view of a display substrate according to an embodiment of the present disclosure.

In an exemplary embodiment, FIG. 4 is a top view of a display substrate according to an embodiment of the present disclosure. As shown in FIG. 4, the display substrate according to the embodiment of the present disclosure further includes multiple rows of gate lines and multiple columns of data lines disposed on the substrate; each sub-pixel is defined by intersection of gate lines and data lines, and the sub-pixels respectively correspond to the gate lines and data lines one by one. The gate lines include a first gate line G1 and a second gate line G2. Four sub-pixels are taken as an example in FIG. 4, FIG. 2A is a section view along A-A of FIG. 4 and FIG. 2B is a section view along B-B of FIG. 4.

In an exemplary embodiment, the first gate line G1 and the second gate line G2 are disposed in a same layer as a gate electrode of a transistor, and a data line Data is disposed in a same layer as source and drain electrodes of the transistor.

In an exemplary embodiment, for each sub-pixel, a first electrode C1 is respectively connected to a first electrode 33 of a switch transistor T1 and a gate electrode 22 of a drive transistor T2, and a second electrode C2 is respectively connected to a first electrode 23 of the drive transistor T2 and a first electrode 43 of a sense transistor T3. The gate electrode 22 of a switch transistor T1 is connected to the first gate line G1 among the gate lines corresponding to the sub-pixel, a second electrode 34 of the switch transistor T1 is connected to the data line Data corresponding to the sub-pixel, and a gate electrode of the sense transistor T3 is connected to the second gate line G2 among the gate lines corresponding to the sub-pixel.

In an exemplary embodiment, as shown in FIG. 4, for each sub-pixel, a non-light-emitting region includes a first non-light-emitting region and a second non-light-emitting region, wherein the first non-light-emitting region and the second non-light-emitting region are on two sides of the light-emitting region AA and disposed along an extending direction of the data line Data.

In an exemplary embodiment, the sense transistor T3 and the second gate line G2 are all in the first non-light-emitting region, and the switch transistor T1, the drive transistor T2 and the first gate line G1 are all in the second non-light-emitting region.

In an exemplary embodiment, as shown in FIG. 3, the display substrate further includes a power supply line VDD and a sense line Sense which are disposed in a same layer as the data line Data. Each pixel includes four sub-pixels disposed along an extending direction of the gate lines, and each pixel corresponds to two columns of power supply lines and one column of sense line.

In an exemplary embodiment, pixel structures of a second sub-pixel and a third sub-pixel are symmetrically disposed, and a first sub-pixel and a fourth sub-pixel are symmetrically disposed.

For each pixel, the sense line Sense corresponding to the pixel is located between the second sub-pixel P2 and the third sub-pixel P3, one column of power supply line VDD corresponding to the pixel is on a side of the first sub-pixel P1 away from the second sub-pixel P2, and another column of power supply line VDD corresponding to the pixel is on a side of the fourth sub-pixel P4 away from the third sub-pixel P3.

A data line Data corresponding to the first sub-pixel P1 is on a side of the first sub-pixel P1 close to the second sub-pixel P2. A data line corresponding to the second sub-pixel P2 is on a side of the second sub-pixel P2 close to the first sub-pixel P1. A data line corresponding to the third sub-pixel P3 is on a side of the third sub-pixel P3 close to the fourth sub-pixel P4, and a data line corresponding to the fourth sub-pixel P4 is on a side of the fourth sub-pixel P4 close to the third sub-pixel P3.

In an exemplary embodiment, as shown in FIG. 4, the display substrate according to the embodiment of the present disclosure further includes a power connection lines VL disposed in a same layer as a gate electrode of a transistor and sensing connections line SL disposed in a same layer as a light shield layer, and each pixel corresponds to two power supply connection lines disposed in an extending direction of the gate line and two sensing connection lines SL disposed in the extending direction of the gate line. The power supply connection lines VL respectively correspond to the power supply lines VDD, the power supply connection lines VL are connected to corresponding power supply lines, and the two sensing connection lines SL are connected to the sense line Sense.

In an exemplary embodiment, a second electrode of a drive transistor of the second sub-pixel P2 is connected to a power supply connection line VL. A second electrode of a drive transistor of the third sub-pixel P3 is connected to another power supply connection line VL. A second electrode of a sense transistor of the first sub-pixel P1 is connected to a sensing connection line SL through an active layer of the sense transistor. A second electrode of a sense transistor of the fourth sub-pixel P4 is connected to another sensing connection line SL through an active layer of the sense transistor.

In an exemplary embodiment, a sensing connection line SL may have a single-layer structure or a double-layer structure. When the sensing connection line SL has a single-layer structure, it is disposed in a same layer as a light shield layer or a second electrode. When a sensing connection line SL has a double-layer structure, a first layer of the sensing connection line is disposed in a same layer as the light shield layer, and a second layer of the sensing connection line is disposed in a same layer as the second electrode. The sensing connection line and the light shield layer disposed in the same layer are taken as an example in FIG. 3.

In an exemplary embodiment, as shown in FIG. 2A and FIG. 2B, the display substrate according to the embodiment of the present disclosure further includes a gate insulating layer 13 disposed between a gate electrode and an active layer of the transistor, and includes an interlayer insulating layer 14 disposed between source and drain electrodes and the active layer of the transistor.

An orthographic projection of the gate insulating layer 13 on the base substrate 10 coincides with an orthographic projection of the gate electrode of the transistor on the base substrate 10.

In an exemplary embodiment, the interlayer insulating layer 14 is provided with a via hole exposing a conductive region of the active layer, and the source and drain electrodes of multiple transistors are connected to the conductive region of the active layer through the via hole.

In an exemplary embodiment, the buffer layer 12, the gate insulating layer 13, and the interlayer insulating layer 14 are made of silicon oxide, silicon nitride or a composite of silicon oxide and silicon nitride, which is not limited in the embodiments of the present disclosure.

In an exemplary embodiment, as shown in FIG. 3, for each sub-pixel, the buffer layer 12 is further provided with a third via hole V3, which exposes a sensing connection line SL. A first conductive region of a sense transistor T3 is connected to the sensing connection line SL through the third via hole V3.

Figure 5:
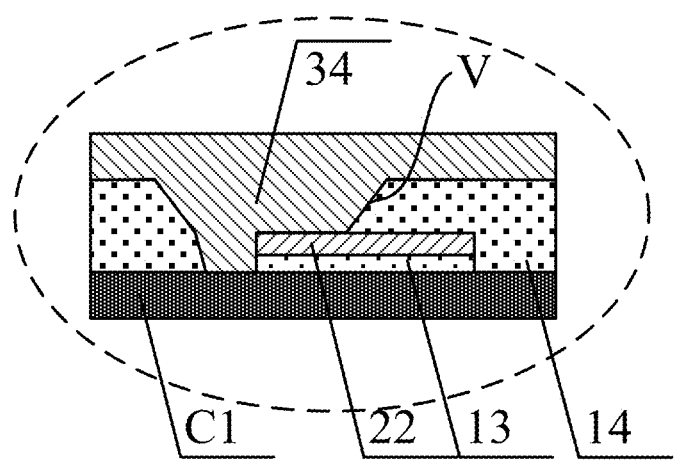
FIG. 5 is another schematic diagram of a local structure according to an embodiment of the present disclosure.

In an exemplary embodiment, FIG. 5 is a schematic diagram of local structure replacement according to an embodiment of the present disclosure. As shown in FIG. 5, an interlayer insulating layer 14 in a display substrate according to the embodiment of the present disclosure includes a via hole V, wherein the via hole V is on a second side of a light-emitting region and exposes a gate electrode 22 and a first electrode C1 of a drive transistor at the same time. A first electrode 33 of a switch transistor T1 is connected to the gate electrode 22 and the first electrode C1 of the drive transistor T2 through the via hole V.

In an exemplary embodiment, the via hole V is a semi-buried hole, and the via hole V on the interlayer insulating layer may be made by a halftone mask.

In an exemplary embodiment, a first electrode C1 is made of a same material as a conductive region, and the conductive region includes a first conductive region or a second conductive region.

In an exemplary embodiment, the first electrode C1 is made of a conductive active layer, which includes a transparent metal oxide and the transparent metal oxide includes Indium Gallium Zinc Oxide (abbreviated as IGZO), etc., which is not limited in the embodiments of the present disclosure.

In an exemplary embodiment, a second electrode C2 is made of a transparent conductive material, and the transparent conductive material includes Indium Tin Oxides (abbreviated as ITO), Zinc Tin Oxide, etc., which is not limited in the embodiments of the present disclosure.

Figure 6:
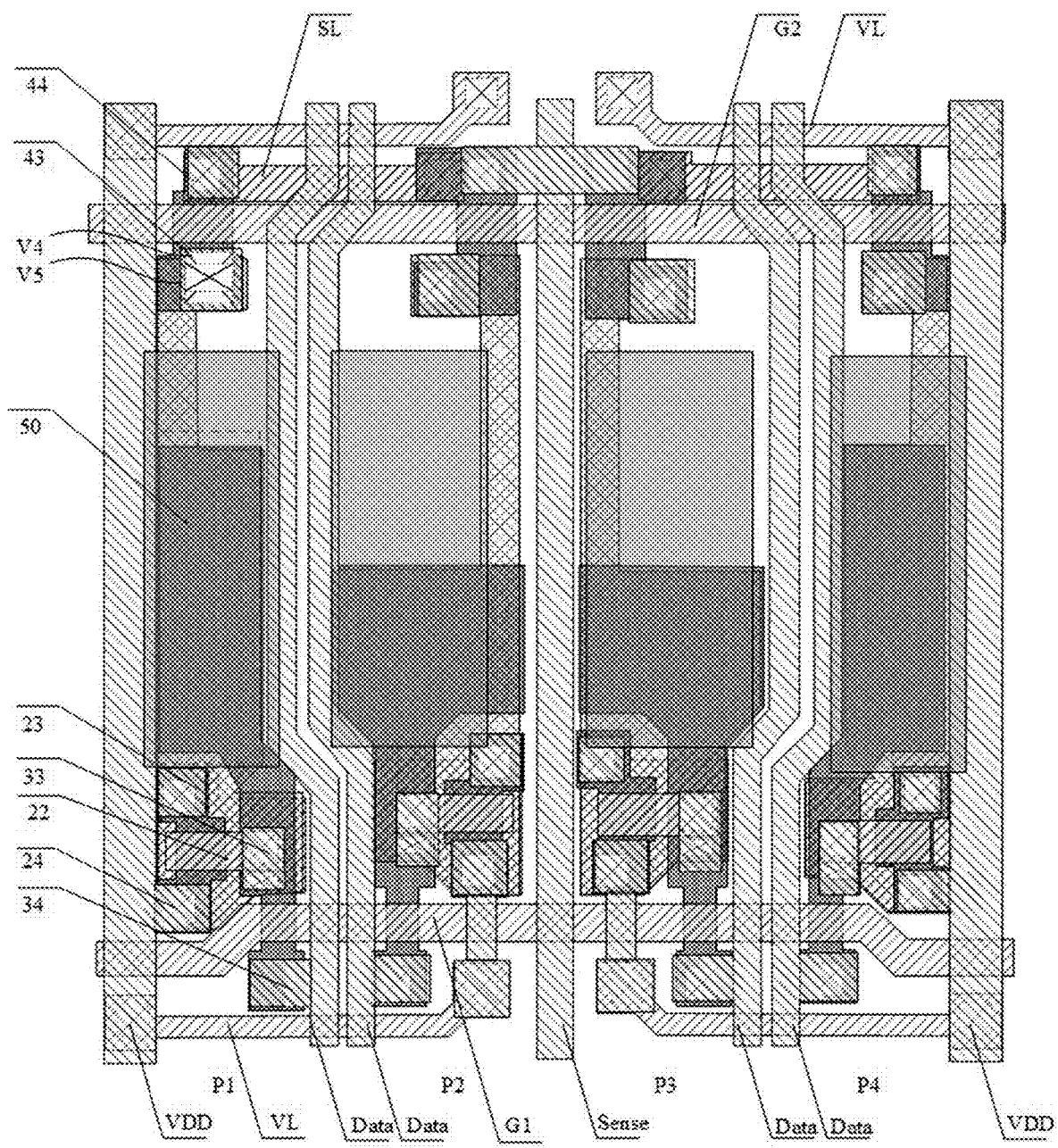
FIG. 6 is another top view of a display substrate according to an embodiment of the present disclosure.
Figure 7:
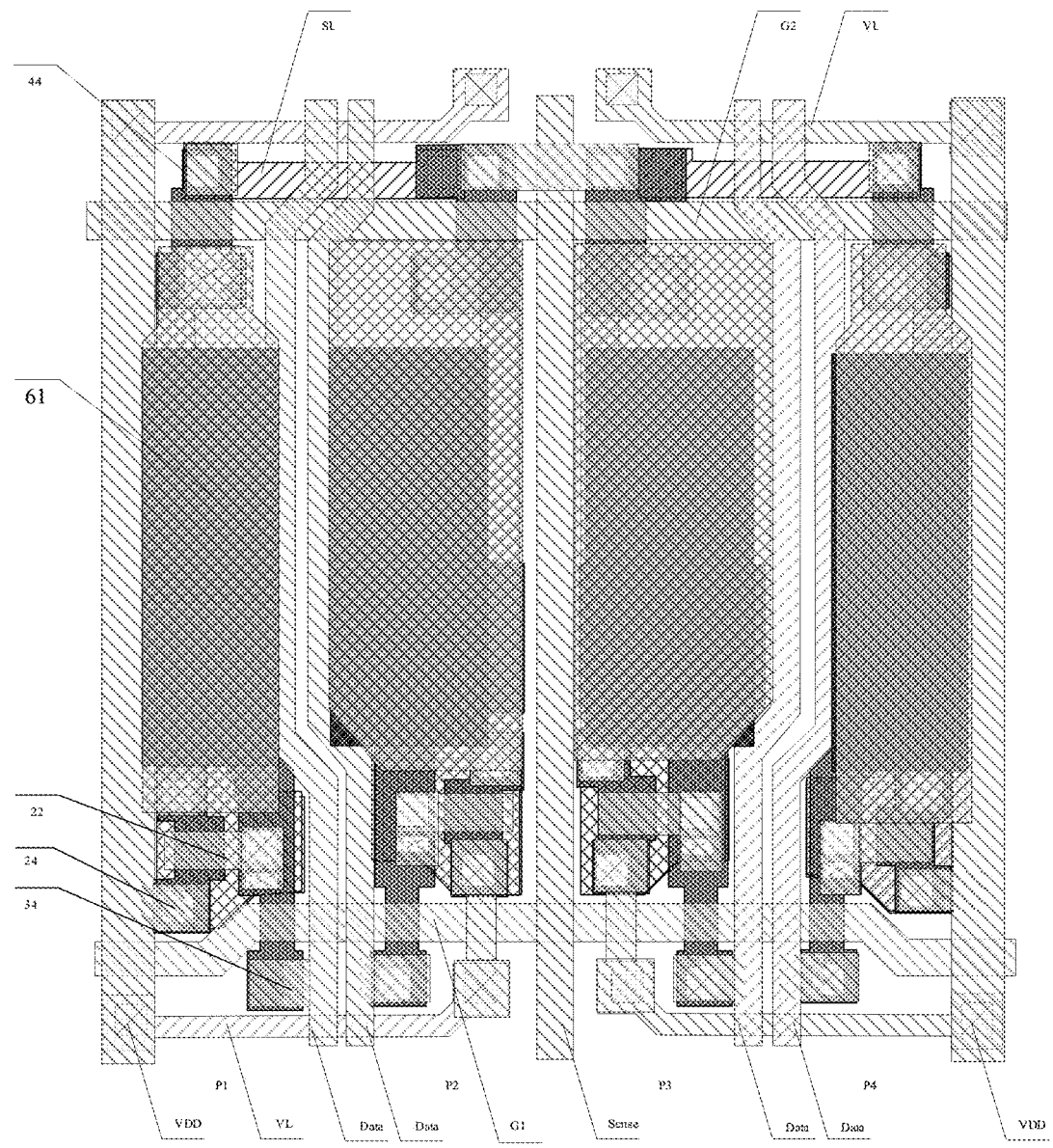
FIG. 7 is another top view of a display substrate according to an embodiment of the present disclosure.

In an exemplary embodiment, FIG. 6 is another top view of the display substrate according to the embodiment of the present disclosure, and FIG. 7 is another top view of the display substrate according to the embodiment of the present disclosure. As shown in FIGS. 2, 6 and 7, each sub-pixel is further provided with a light emitting element and a filter 50 with a same color as the sub-pixel. The light emitting element includes an anode 61, an organic light-emitting layer 62 and a cathode 63 which are sequentially disposed, wherein the anode 61 is connected to a first electrode 43 of a sense transistor T3, the anode 61 is a transmission electrode, and the cathode 63 is a reflection electrode.

In an exemplary embodiment, the anode 61 may be made of a transparent conductive material, such as indium tin oxide (ITO), zinc tin oxide, etc., which is not limited in the embodiments of the present disclosure.

In an exemplary embodiment, the cathode 63 is made of metal, such as silver, aluminum, etc., which is not limited in the embodiments of the present disclosure.

In an exemplary embodiment, an orthographic projection of the light emitting element on the base substrate 10 overlaps with a light-emitting region AA, and the filter 50 is in the light-emitting region AA and disposed on a side of the light emitting element close to the base substrate 10. An orthographic projection of the anode 61 on the base substrate 10 covers an orthographic projection of the filter 50 on the base substrate 10.

In an exemplary embodiment, as shown in FIG. 2A and FIG. 2B, the display substrate according to the embodiment of the present disclosure further includes a passivation layer 15 disposed on a side of source and drain electrodes of the transistor away from the base substrate 10, a flat layer 16 disposed between the anode 61 and the filter 50, and a pixel defining layer 17 disposed on a side of the flat layer 16 away from the base substrate 10 for defining a sub-pixel region.

In an exemplary embodiment, as shown in FIG. 6, the passivation layer 15 is disposed on a side of the filter 50 close to the base substrate 10, and the flat layer 16 is disposed between the light emitting element and the filter 50. The passivation layer 15 is provided with a fourth via hole V4 exposing the first electrode 43 of the sense transistor T3, and the flat layer 16 is provided with a fifth via hole V5 exposing the fourth via hole V4.

The anode 61 is connected to the first electrode 43 of the sense transistor T3 through the fourth via hole V4 and the fifth via hole V5. An orthogonal projection of the fifth via hole V5 on the base substrate 10 does not completely coincide with an orthogonal projection of the second via hole V2 on the base substrate 10.

In an exemplary embodiment, as shown in FIG. 2A and FIG. 2B, the display substrate according to the embodiment of the present disclosure further includes a supporting part 70 disposed on a side of the light emitting element away from the base substrate 10 and a cover plate 80 disposed on a side of the supporting part 70 away from the base substrate 10.

In an exemplary embodiment, the cover plate 80 is configured to protect the light emitting elements, wherein the cover plate 80 may be a glass cover plate.

Based on the same inventive concept, an embodiment of the present disclosure further provides a display apparatus, including a display substrate.

In an exemplary embodiment, the display apparatus may be any product or component with a display function such as a mobile phone, a tablet computer, a television, a display, a laptop computer, a digital photo frame, a navigator, etc. Other essential components of the display apparatus is well known to those of ordinary skill in the art, which will not be described in detail here, and should not be taken as a limitation on the present disclosure. The implementation of the display apparatus may refer to the embodiment of the display substrate described above, and the repetition will not be described in detail here.

The display substrate is the display substrate provided in the preceding embodiments, and has similar implementation principles and implementation effects, which will not be described further here.

Figure 8:
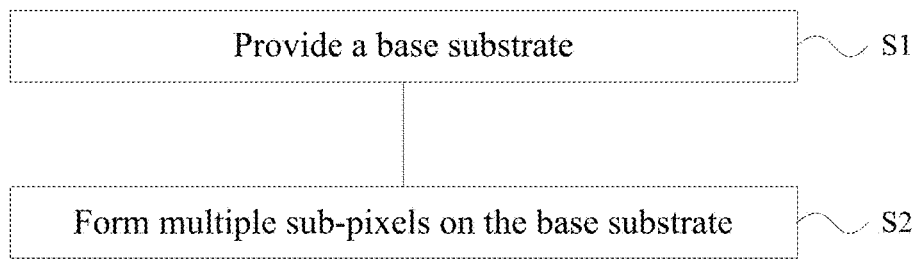
FIG. 8 is a flowchart of a method for manufacturing a display substrate according to an embodiment of the present disclosure.

Based on the same inventive concept, some embodiments of the present disclosure further provide a method for manufacturing a display substrate. FIG. 8 is a flowchart of the method for manufacturing a display substrate according to an embodiment of the present disclosure. As shown in FIG. 8, the method for manufacturing a display substrate according to the embodiment of the present disclosure includes the following steps:

Step S1: providing a base substrate.

In an exemplary embodiment, the base substrate may be a rigid substrate or a flexible substrate, wherein the rigid substrate may be, but is not limited to, one or more of glass and metal foils; and the flexible substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

Step S2: forming multiple sub-pixels on the base substrate.

In an exemplary embodiment, the sub-pixels are disposed in an array on the base substrate, wherein one sub-pixel is taken as an example in FIG. 2.

In an exemplary embodiment, each sub-pixel includes a light-emitting region and a non-light-emitting region, and each sub-pixel is provided with a drive circuit. The drive circuit includes a storage capacitor and multiple transistors. The multiple transistors include a switch transistor, a drive transistor and a sense transistor.

For each sub-pixel, the multiple transistors are in the non-light-emitting region, the storage capacitor is a transparent capacitor, and an orthographic projection of the storage capacitor on the base substrate coincides with the light-emitting region. A first electrode of the storage capacitor is disposed in a same layer as active layers of the multiple transistors, and a second electrode of the storage capacitor is on a side of the first electrode close to the base substrate.

A first electrode of the drive transistor is connected to the second electrode through an active layer of the drive transistor, and a first electrode of the sense transistor is connected to the second electrode through an active layer of the sense transistor.

The display substrate is the display substrate provided in the preceding embodiments, and has similar implementation principles and implementation effects, which will not be described further here.

In an exemplary embodiment, the display substrate further includes gate lines, data lines, power supply lines and sense lines, wherein the gate lines include a first gate line and a second gate line, and step S2 specifically includes forming a light shield layer and the second electrode on the base substrate; forming a first electrode and active layers of the multiple transistors on the light shield layer and the second electrode; forming gate electrodes of the multiple transistors, the first gate line and the second gate line on the first electrode and the active layers of the multiple transistors; forming the data lines, the power supply lines, the sense lines and source and drain electrodes of the multiple transistors on the gate electrodes of the transistors, the first gate line and the second gate line; sequentially forming filters and light emitting elements on the data lines, the power supply lines, the sense lines and the source and drain electrodes of the multiple transistors.

In an exemplary embodiment, forming the light shield layer and the second electrode on the base substrate includes sequentially forming the light shield layer and the second electrode on the base substrate, or sequentially forming the second electrode and the light shield layer on the base substrate or simultaneously forming the second electrode and the light shield layer on the base substrate.

In an exemplary embodiment, sequentially forming the light shield layer and the second electrode on the base substrate includes forming the light shield layer on the base substrate using a first mask and forming the second electrode on the light shield layer using a second mask.

In an exemplary embodiment, sequentially forming the second electrode and the light shield layer on the base substrate includes forming the second electrode on the base substrate using the second mask by a patterning process and forming the light shield layer on the second electrode using the first mask.

In an exemplary embodiment, simultaneously forming the second electrode and the light shield layer on the base substrate includes sequentially depositing a shading thin film and a transparent conductive thin film on the base substrate, and simultaneously forming the second electrode and the light shield layer using a halftone mask.

In an exemplary embodiment, the patterning process includes: photoresist coating, exposure, development, etching, photoresist stripping, etc.

In an exemplary embodiment, forming the first electrode and the active layers of the multiple transistors on the light shield layer and the second electrode includes forming a buffer layer including a first via hole, a second via hole and a third via hole on the light shield layer and the second electrode; the first via hole and the second via hole exposing the second electrode, and the third via hole exposing a sensing connection line; forming the first electrode and the active layers of the multiple transistors on the buffer layer using a same manufacturing process.

In an exemplary embodiment, sequentially forming the filters and the light emitting elements on the data lines, the power supply lines, the sense lines and the source and drain electrodes of the multiple transistors includes forming a passivation layer including a fourth via hole on the data lines, the power supply lines, the sense lines and the source and drain electrodes of the multiple transistors; the fourth via hole exposing the first electrode of the sense transistor; sequentially forming an filter and a flat layer including a fifth via hole on the passivation layer; the fifth via hole exposing a seventh via hole; forming the light emitting elements on the flat layer.

Figure 9A:
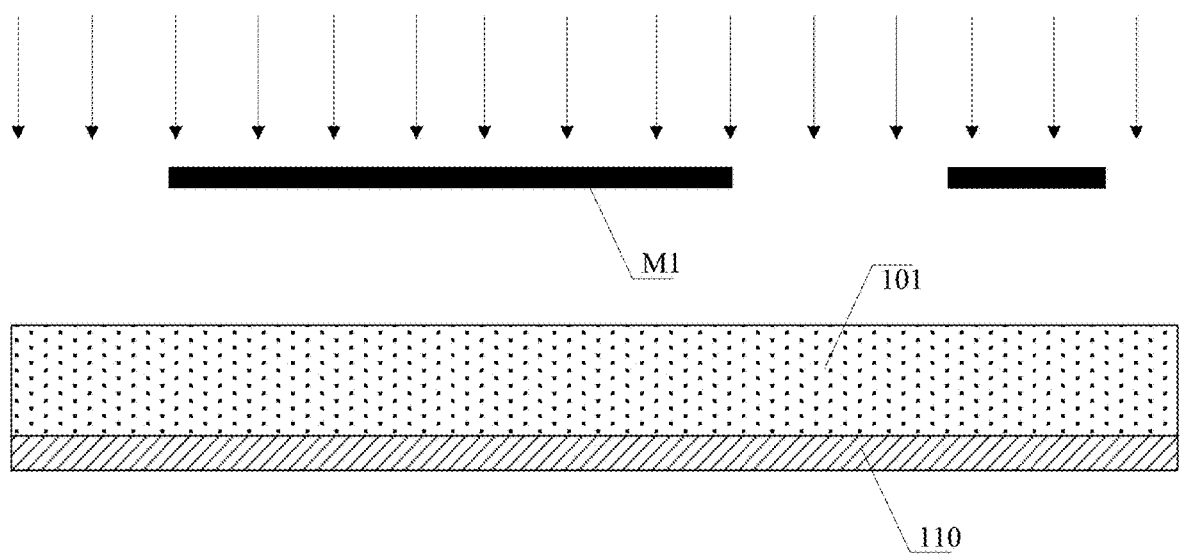
FIGS. 9A-9H are schematic diagrams showing manufacturing of light shield layers and second electrodes according to an embodiment of the present disclosure.

Taking the light shield layer on a side of the second electrode close to the base substrate as an example, the manufacturing process of the light shield layer and the second electrode will be further explained with reference to FIGS. 9A-9H, which includes the following steps:

Step 110: depositing a light shielding thin film 110 on a base substrate, coating a photoresist 101 on the light shielding thin film 110, and exposing the photoresist through a first mask M1, as shown in FIG. 9A.

Figure 9B:
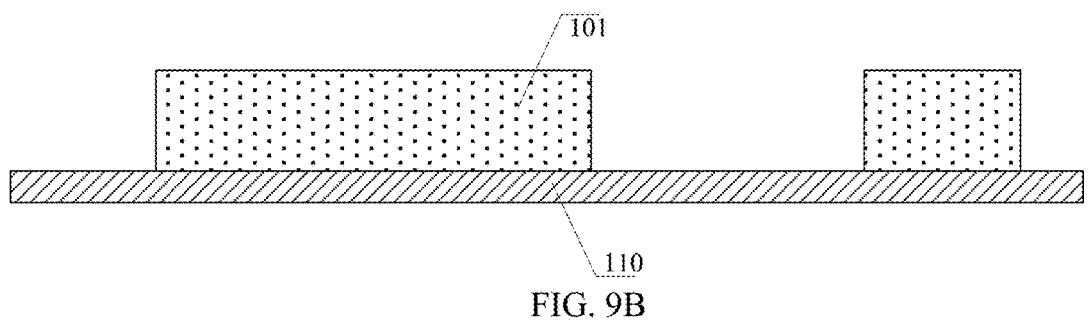

Step 120: developing the photoresist 101, as shown in FIG. 9B.

Figure 9C:
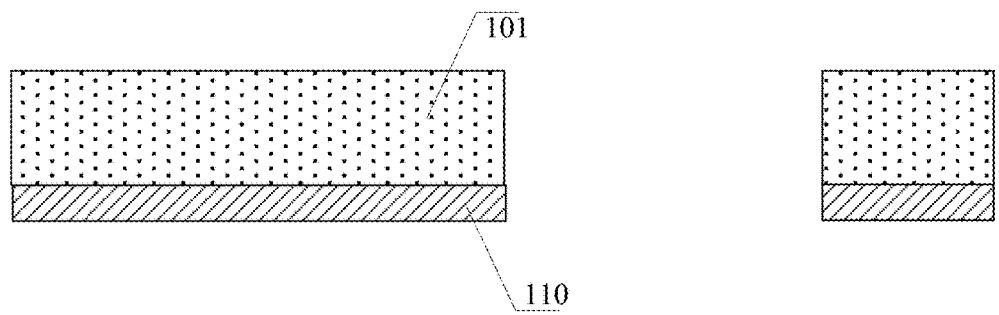

Step 130: etching off the light shielding thin film uncovered with the photoresist 101, as shown in FIG. 9C.

Figure 9D:
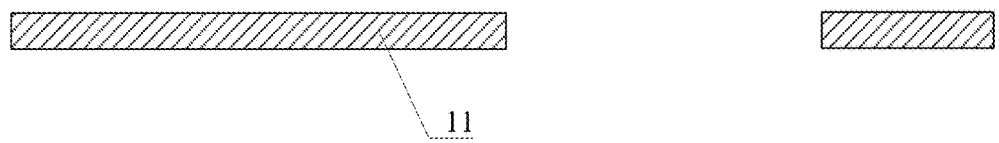

Step 140: stripping the photoresist 101 to form a light shield layer 11, as shown in FIG. 9D.

Figure 9E:
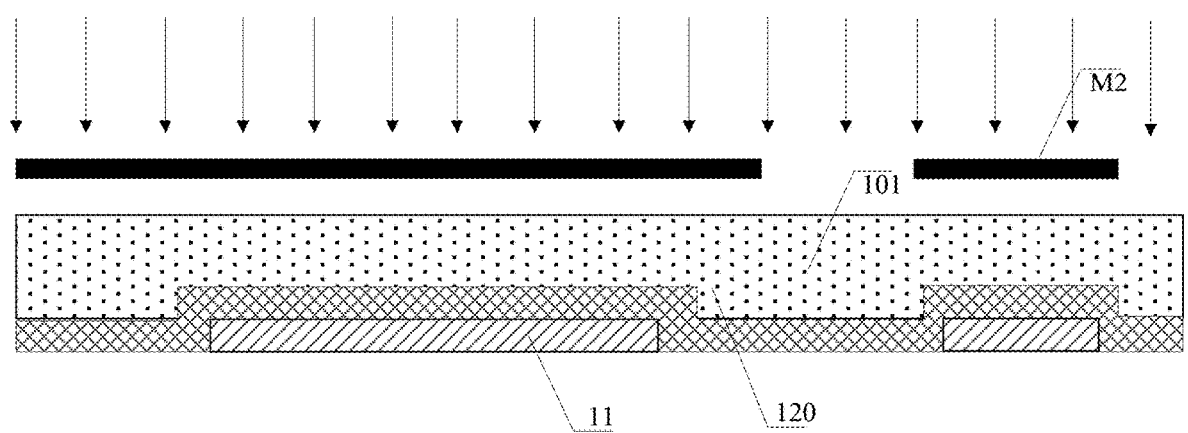

Step 150: depositing a transparent conductive thin film 120 on the light shield layer 11, and coating the photoresist 101 on the transparent conductive thin film 120, and exposing the photoresist through a second mask M2, as shown in FIG. 9E.

Figure 9F:
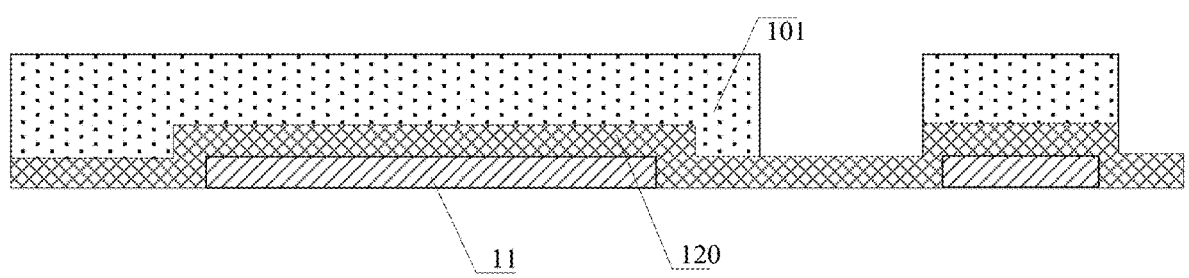

Step 160: developing the photoresist 101, as shown in FIG. 9F.

Figure 9G:
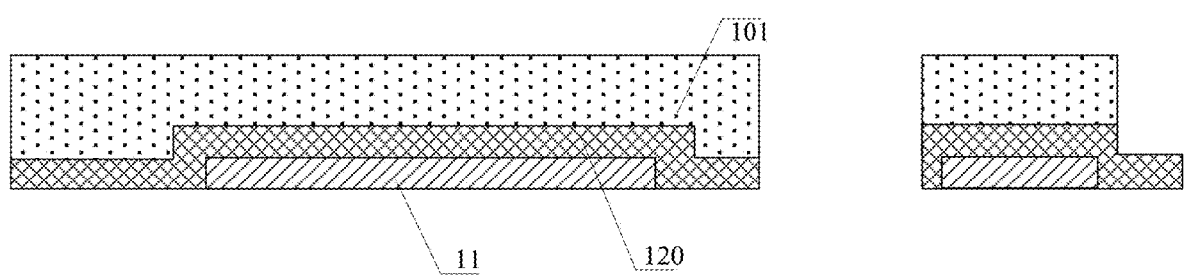

Step 170: etching off the transparent conductive thin film uncovered with the photoresist 101, as shown in FIG. 9G.

Figure 9H:
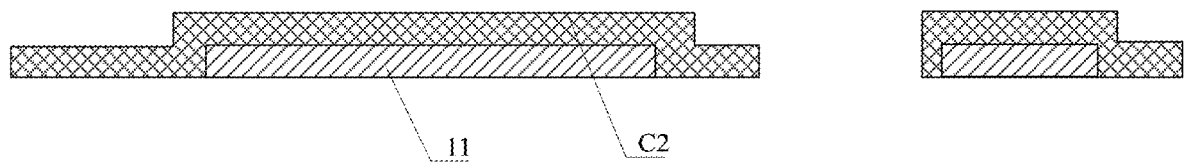

Step 180: stripping the photoresist 101 to form a second electrode C2, as shown in FIG. 9H.

In an exemplary embodiment, forming the first electrode and the active layers of the multiple transistors on the light shield layer and the second electrode includes forming a buffer layer including a first via hole, a second via hole and a third via hole on the light shield layer and the second electrode; forming the first electrode and the active layers of the multiple transistors on the buffer layer using the same manufacturing process.

In an exemplary embodiment, the first via hole and the second via hole expose the second electrode, and the third via hole exposes a sensing connection line.

Figure 10:
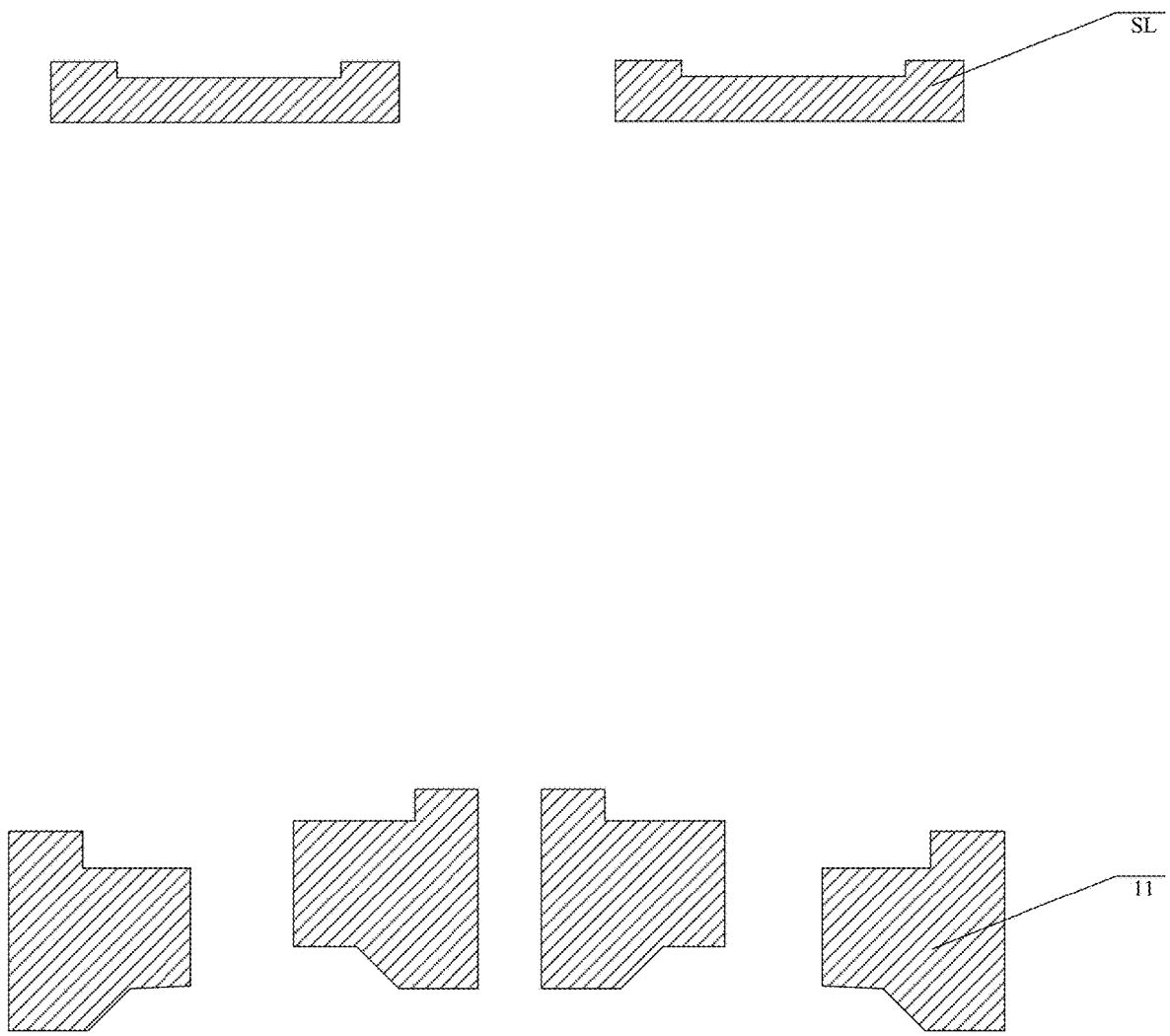
FIG. 10 is a schematic diagram of Step 100 of a method for manufacturing a display substrate according to an embodiment of the present disclosure.

Taking an example in which there are four sub-pixels, the sensing connection line has a single-layer structure and is disposed in a same layer as a light shield layer, and the light shield layer is disposed on a side of the second electrode close to the base substrate, a method for manufacturing a display substrate according to an embodiment of the present disclosure will be further explained with reference to FIGS. 10 to 16, the method includes the following steps:

Step 100: a light shield layer 11 and a sensing connection line are formed on a base substrate, as shown in FIG. 10.

Figure 11:
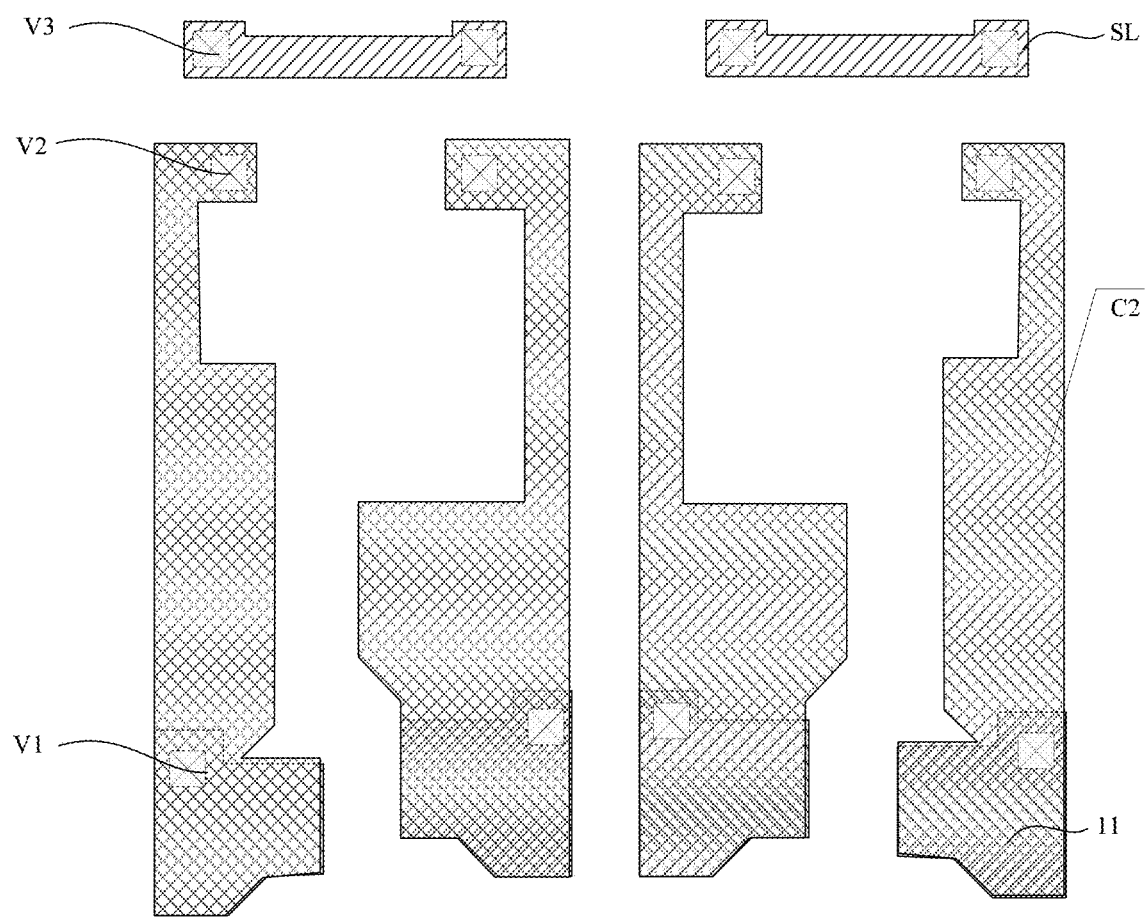
FIG. 11 is a schematic diagram of Step 200 of a method for manufacturing a display substrate according to an embodiment of the present disclosure.

Step 200: sequentially forming a second electrode C2 and a buffer layer (not shown in the figure) on the light shield layer 11 and the sensing connection line SL, as shown in FIG. 11.

The buffer layer is provided with a first via hole V1 and a second via hole V2 exposing the second electrode C2, and a third via hole V3 exposing the sensing connection line SL.

Figure 12:
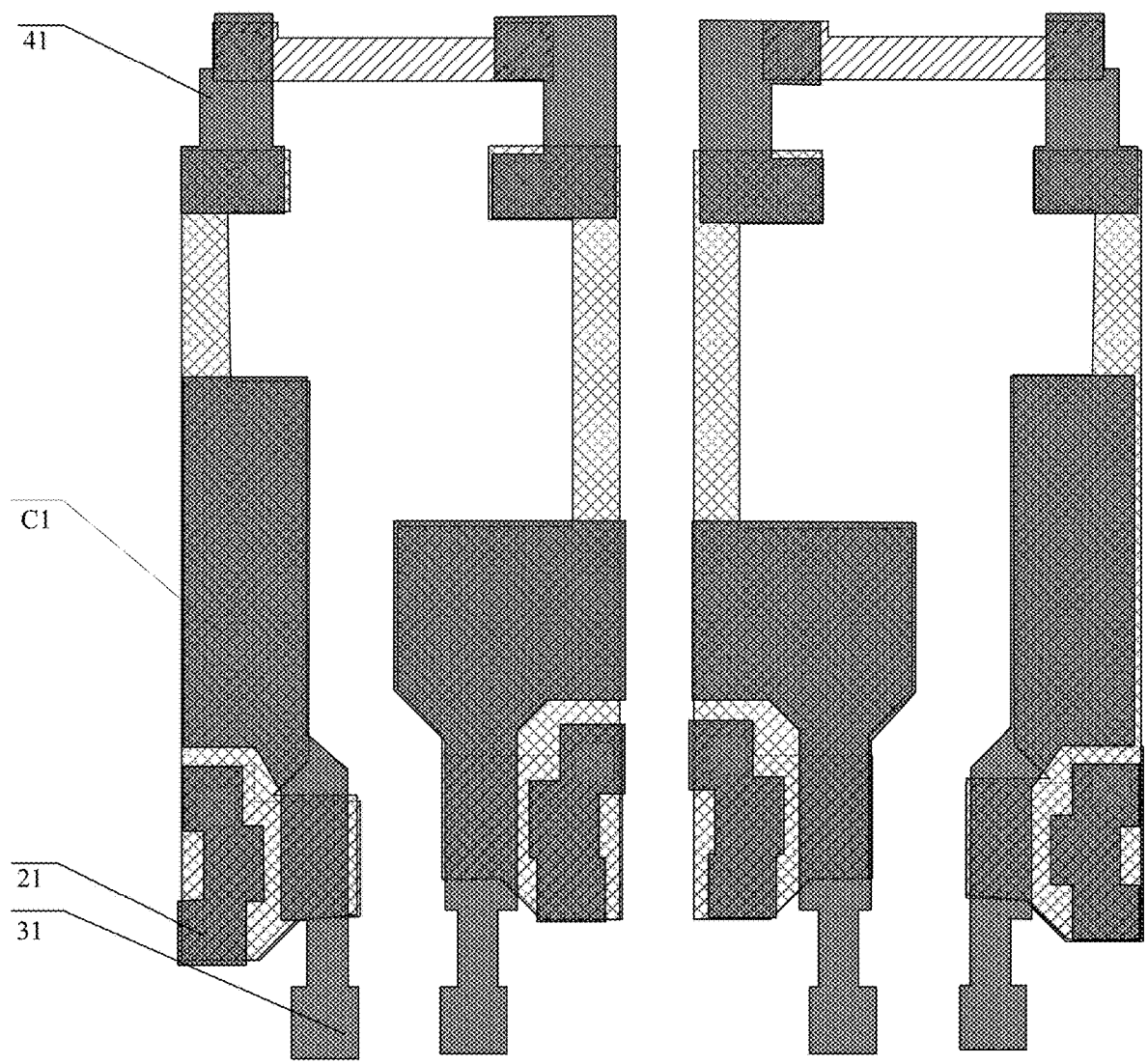
FIG. 12 is a schematic diagram of Step 300 of a method for manufacturing a display substrate according to an embodiment of the present disclosure.

Step 300: forming a first electrode C1, an active layer 31 of a switch transistor, an active layer 21 of a drive transistor and an active layer 41 of a sense transistor on the buffer layer, as shown in FIG. 12.

Figure 13:
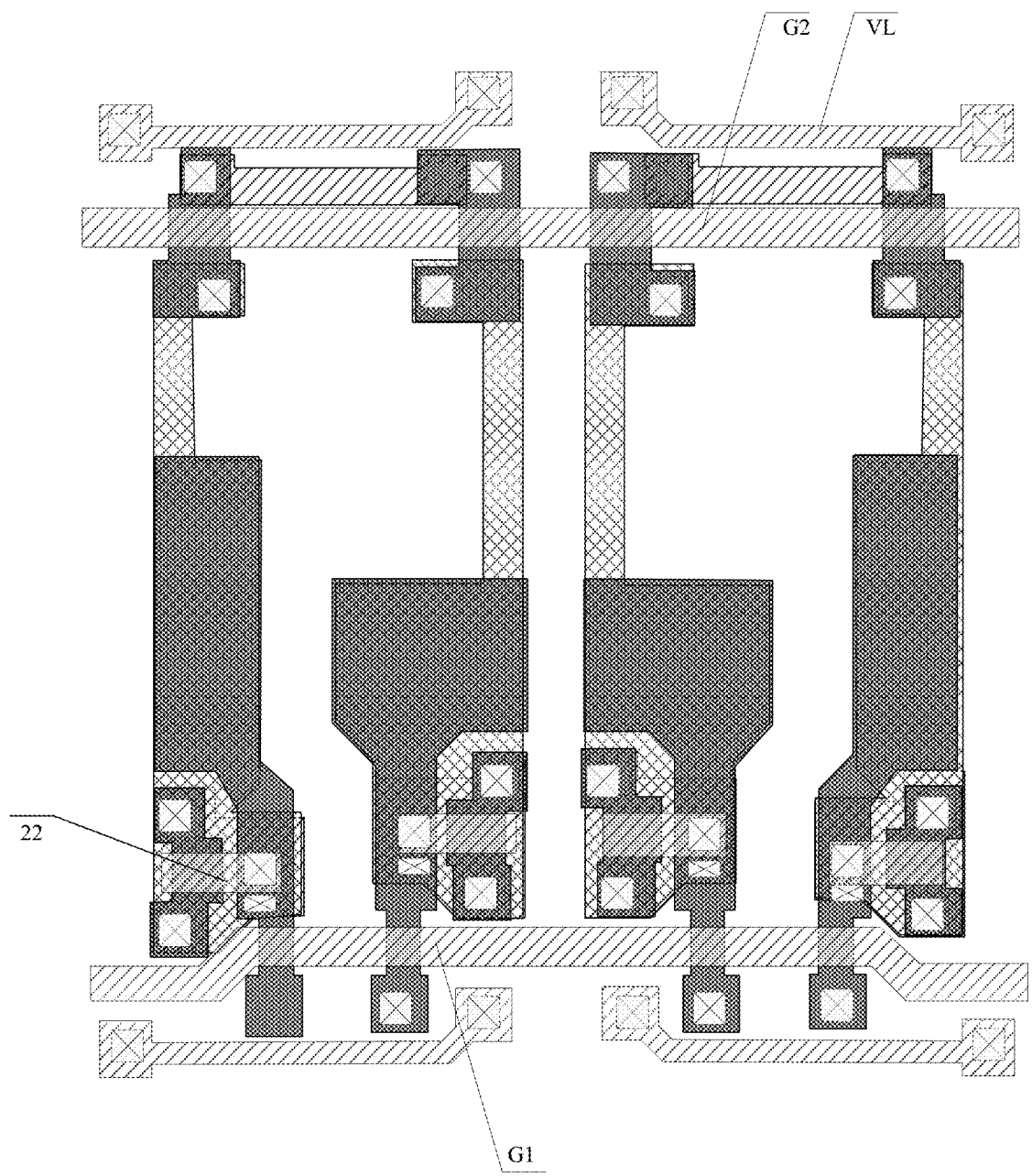
FIG. 13 is a schematic diagram of Step 400 of a method for manufacturing a display substrate according to an embodiment of the present disclosure.

Step 400: forming a gate insulating layer on the active layer 31 of the switch transistor, the active layer 21 of the drive transistor and the active layer 41 of the sense transistor and forming a gate electrode 32 of the switch transistor, a gate electrode 22 of the drive transistor and a gate electrode of the sense transistor, a first gate line G1, a second gate line G2 and a power supply connection line VL on the gate insulating layer, as shown in FIG. 13.

Figure 14:
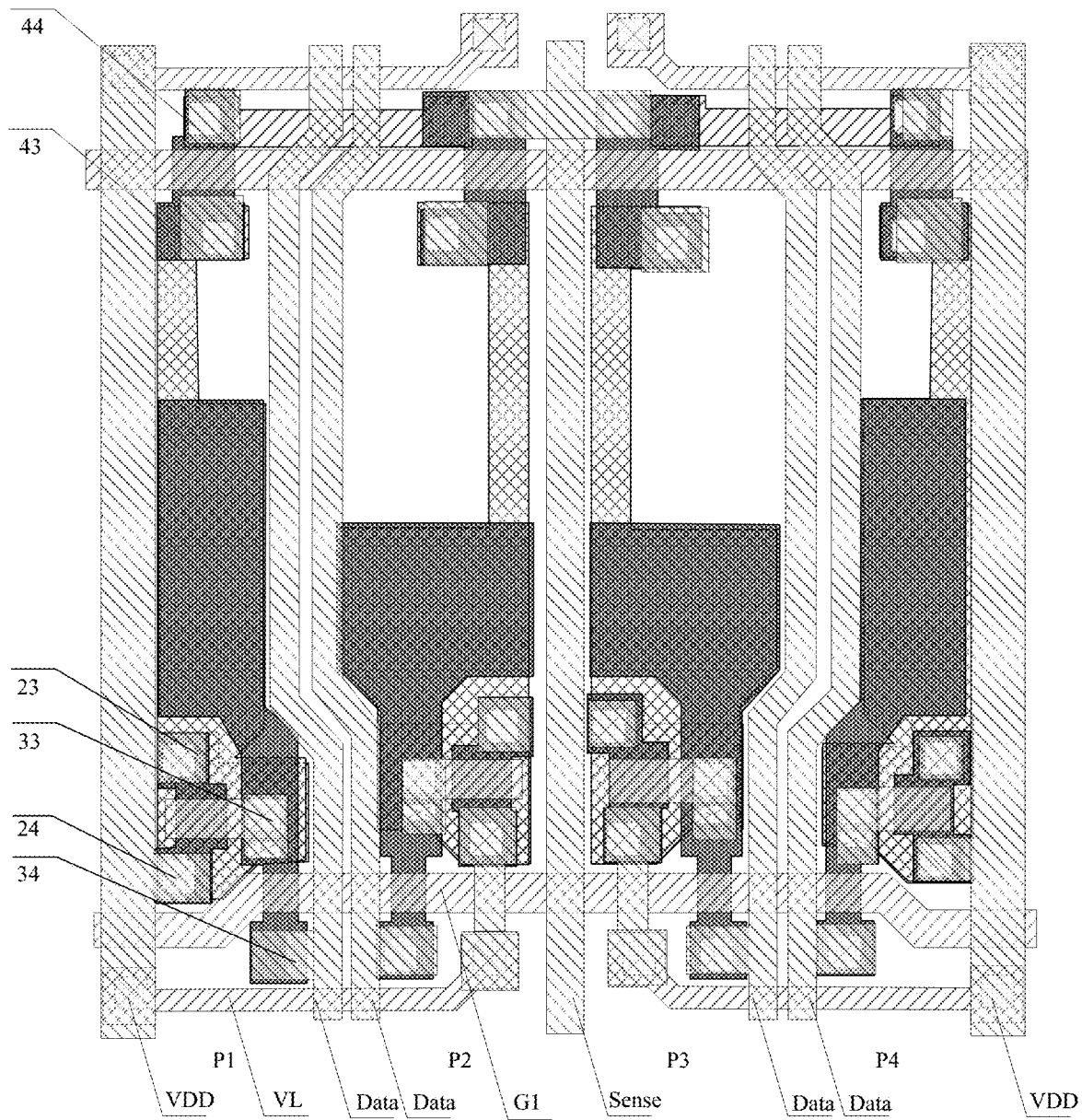
FIG. 14 is a schematic diagram of Step 500 of a method for manufacturing a display substrate according to an embodiment of the present disclosure.

Step 500: forming an interlayer insulating layer on the gate electrode of the transistor, the first gate line, the second gate line and the power supply connection line, and forming a data line Data, a power supply line VDD, a sense line Sense, a first electrode 33 and a second electrode 34 of the switch transistor, a first electrode 23 and a second electrode 24 of the drive transistor and a first electrode 43 and a second electrode 44 of the sense transistor on the interlayer insulating layer, as shown in FIG. 14.

Figure 15:
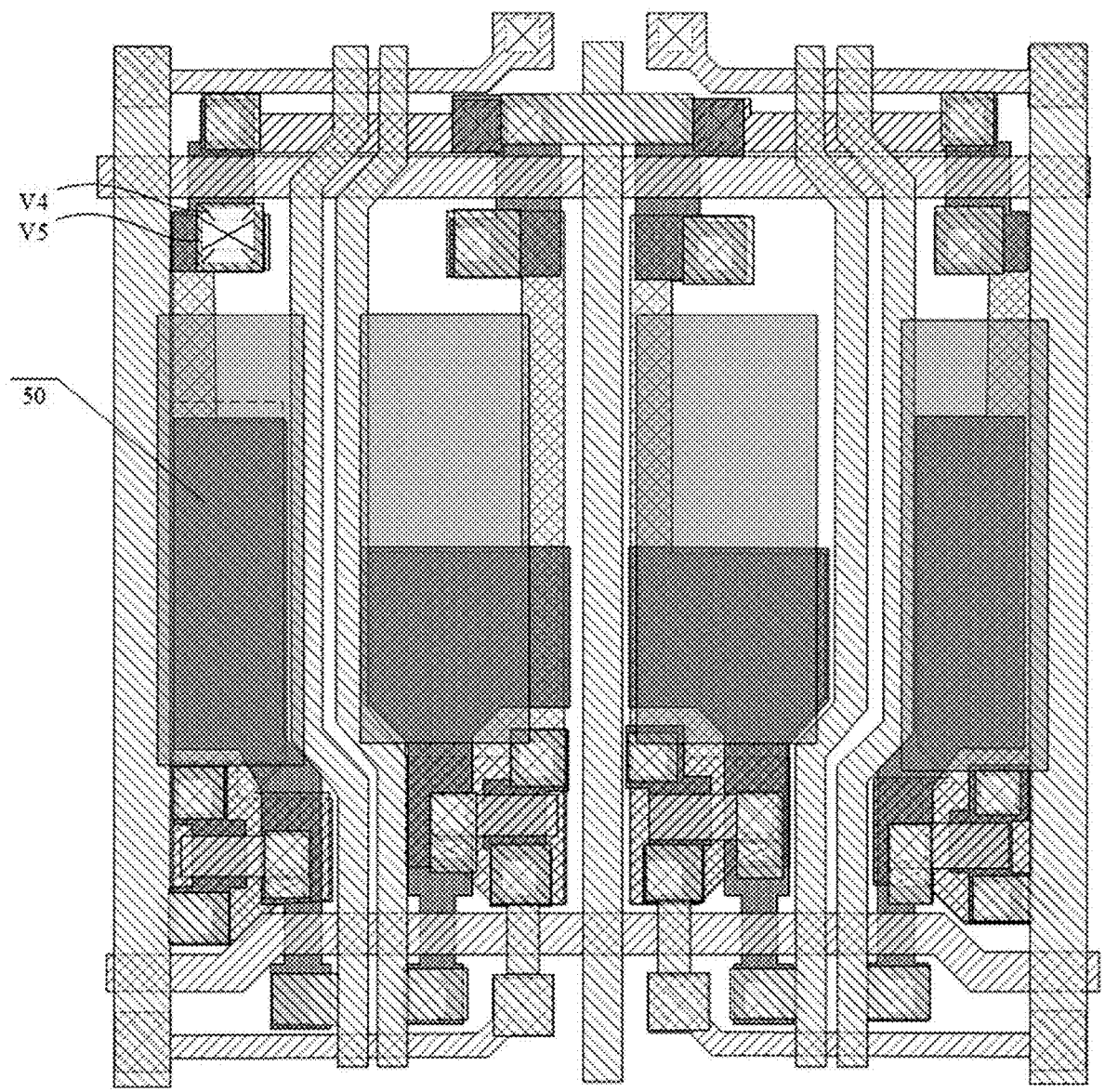
FIG. 15 is a schematic diagram of Step 600 of a method for manufacturing a display substrate according to an embodiment of the present disclosure.

Step 600: forming a passivation layer including a fourth via hole V4 on the data line, the power supply line, the sense line and the source and drain electrodes of the multiple transistors, forming a filter 50 on the passivation layer, and forming a flat layer including a fifth via hole V5 on the filter 50, as shown in FIG. 15.

Figure 16:
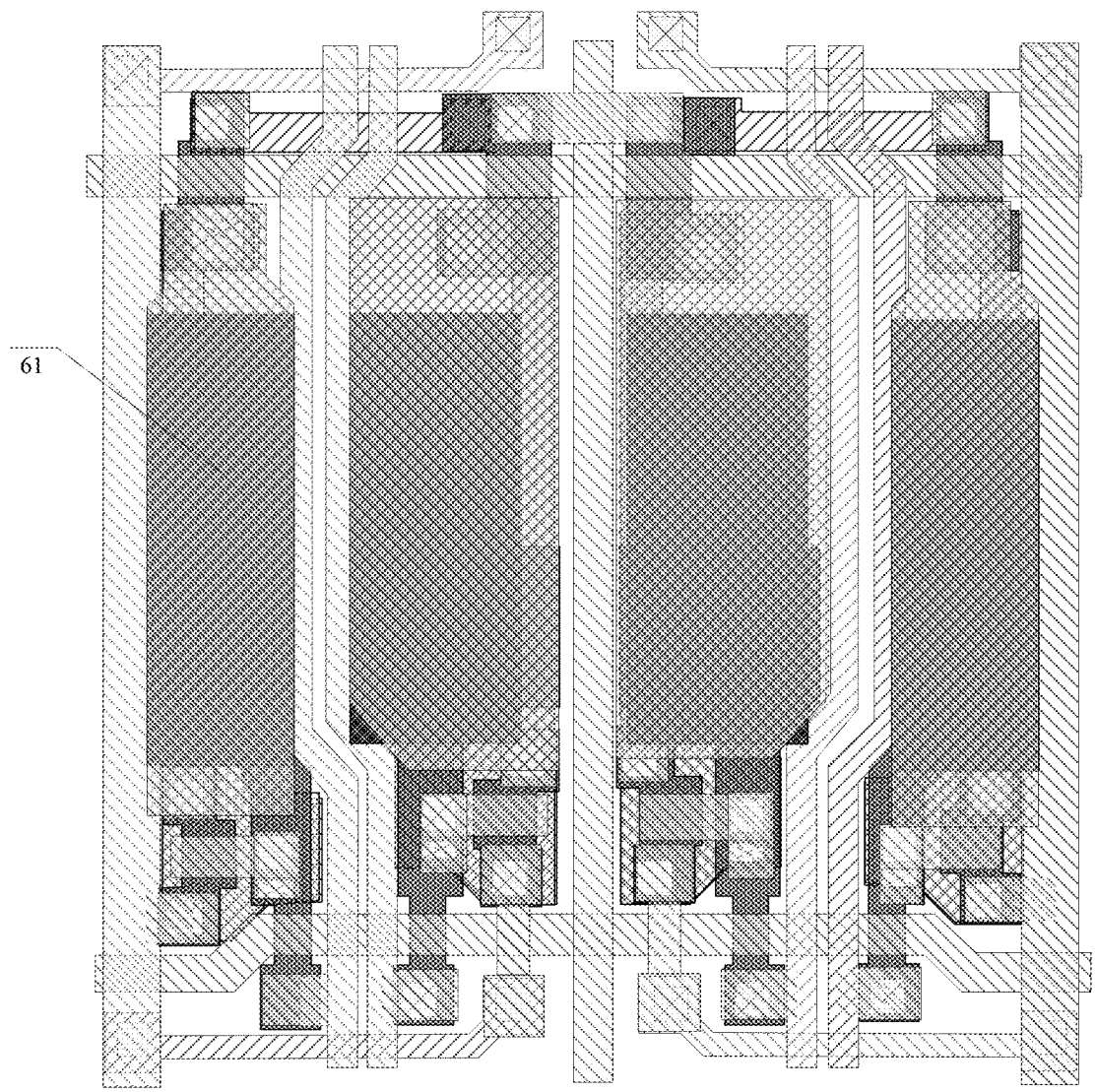
FIG. 16 is a schematic diagram of Step 700 of a method for manufacturing a display substrate according to an embodiment of the present disclosure.

Step 700: forming an anode 61 on the flat layer, as shown in FIG. 16.

Step 800: sequentially forming a pixel defining layer, an organic light-emitting layer and a cathode on the anode, and sequentially disposing a supporting part and a cover plate on the cathode.

The accompanying drawings of the embodiments of the present disclosure only refer to structures involved in the embodiments of the present disclosure, and other structures may refer to general designs.

For the sake of clarity, the thickness and size of layers or microstructures are exaggerated in the accompanying drawings used to describe the embodiments of the present disclosure. It may be understood that when an element such as a layer, a film, a region or a substrate is referred to as being "on" or "under" another element, the element may be "directly" "on" or "under" the another element, or there may be an intervening element therebetween.

Although the embodiments disclosed in the present disclosure are as described above, the described contents are only the embodiments used for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What is claimed is:

1. A display substrate, comprising: a base substrate and a plurality of sub-pixels disposed on the base substrate, wherein each sub-pixel comprises a light-emitting region and a non-light-emitting region, and a drive circuit is provided in each sub-pixel; the drive circuit comprises a storage capacitor and a plurality of transistors; the plurality of transistors comprise a switch transistor, a drive transistor and a sense transistor;

for each sub-pixel, the plurality of transistors are in the non-light-emitting region, the storage capacitor is a transparent capacitor, and an orthographic projection of the storage capacitor on the base substrate coincides with the light-emitting region; light emitted from the light-emitting region exits along a light exit direction, the light exit direction is a direction perpendicular to the base substrate and light exiting from a bottom of the base substrate, the storage capacitor is located at a side close to the base substrate along the light exit direction, and the light passes through the storage capacitor along the light exit direction and emits to the base substrate; a first electrode of the storage capacitor is disposed in a same layer as an active layer of the plurality of transistors and in a different layer from source and drain electrodes of the plurality of transistors, and a second electrode of the storage capacitor is on a side of the first electrode of the storage capacitor close to the base substrate; and a first electrode of the drive transistor is connected to the second electrode of the storage capacitor through an active layer of the drive transistor, the active layer of the drive transistor is passed through a via of an insulating layer under the active layer of the drive transistor, extended to the second electrode of the storage capacitor and connected to the second electrode of the storage capacitor directly, a first electrode of the sense transistor is connected to the second electrode of the storage capacitor through an active layer of the sense transistor, and the active layer of the sense transistor is passed through a via of an insulating layer under the active layer of the sense transistor, extended to the second electrode of the storage capacitor and connected to the second electrode of the storage capacitor directly.

2. The display substrate according to claim 1, wherein for each sub-pixel, an active layer of each transistor comprises a channel region, a first conductive region and a second conductive region;

the first conductive region and the second conductive region are respectively disposed on two sides of the corresponding channel region, a second electrode of each of the plurality of transistors is connected to the first conductive region, and a first electrode of each of the plurality of transistors is connected to the second conductive region; and a second conductive region of the drive transistor is connected to the second electrode of the storage capacitor, and a second conductive region of the sense transistor is connected to the second electrode of the storage capacitor.

3. The display substrate according to claim 2, further comprising a buffer layer disposed on a side of the active layer of the plurality of transistors close to the base substrate, wherein the buffer layer comprises a first via hole and a second via hole that expose the second electrode of the storage capacitor; and the second conductive region of the drive transistor is connected to the second electrode of the storage capacitor through the first via hole, and the second conductive region of the sense transistor is connected to the second electrode of the storage capacitor through the second via hole.

4. The display substrate according to claim 3, wherein the drive transistor further comprises a light shield layer disposed on a side of the buffer layer close to the base substrate;

the second electrode of the storage capacitor is disposed on the side of the buffer layer close to the base substrate, an orthographic projection of the second electrode of the storage capacitor on the base substrate covers an orthographic projection of the light shield layer on the base substrate, and a surface of the light shield layer close to the second electrode of the storage capacitor is completely in contact with the second electrode of the storage capacitor; and the light shield layer is disposed on a side of the second electrode of the storage capacitor close to the base substrate, or the second electrode of the storage capacitor is disposed on a side of the light shield layer close to the base substrate.

5. The display substrate according to claim 3, further comprising a plurality of rows of gate lines and a plurality of columns of data lines disposed on the base substrate; wherein each sub-pixel is defined by intersection of gate lines and data lines, and the plurality of sub-pixels respectively correspond to the plurality of rows of gate lines and the plurality of columns of data lines one by one, wherein the plurality of rows of gate lines comprise a first gate line and a second gate line, the first gate line and the second gate line are disposed in a same layer as gate electrodes of the plurality of transistors, and the plurality of columns of data lines are disposed in a same layer as the source and drain electrodes of the plurality of transistors.

6. The display substrate according to claim 5, wherein for each sub-pixel, the first electrode of the storage capacitor is respectively connected to a first electrode of the switch transistor and a gate electrode of the drive transistor;

a gate electrode of the switch transistor is connected to the first gate line among the gate lines corresponding to the sub-pixel; a second electrode of the switch transistor is connected to a data line corresponding to the sub-pixel, and a gate electrode of the sense transistor is connected to the second gate line among the gate lines corresponding to the sub-pixel.

7. The display substrate according to claim 6, wherein, for each sub-pixel, the non-light-emitting region comprises a first non-light-emitting region and a second non-light-emitting region, the first non-light-emitting region and the second non-light-emitting region are on two sides of the light-emitting region and are disposed along an extending direction of the plurality of columns of data lines;

the sense transistor and the second gate line are both in the first non-light-emitting region, and the switch transistor, the drive transistor and the first gate line are all in the second non-light-emitting region.

8. The display substrate according to claim 5, further comprising power supply lines and sense lines disposed in a same layer as the plurality of columns of data lines, wherein each pixel comprises four sub-pixels disposed along an extending direction of the plurality of rows of gate lines, each pixel corresponding to two columns of power supply lines and one column of sense line;

for each pixel, the sense line corresponding to the pixel is between a second sub-pixel and a third sub-pixel, one column of power supply line corresponding to the pixel is on a side of a first sub-pixel away from the second sub-pixel, and another column of power supply line corresponding to the pixel is on a side of a fourth sub-pixel away from the third sub-pixel;

a data line corresponding to the first sub-pixel is on a side of the first sub-pixel close to the second sub-pixel; a data line corresponding to the second sub-pixel is on a side of the second sub-pixel close to the first sub-pixel; a data line corresponding to the third sub-pixel is on a side of the third sub-pixel close to the fourth sub-pixel, and a data line corresponding to the fourth sub-pixel is on a side of the fourth sub-pixel close to the third sub-pixel;

the display substrate further comprises power supply connection lines disposed in the same layer as the gate electrodes of the plurality of transistors and sensing connection lines disposed in a same layer as a light shield layer, each pixel corresponds to two power supply connection lines disposed along the extending direction of the gate lines and two sensing connection lines disposed along the extending direction of the gate lines; the power supply connection lines respectively correspond to power supply lines; the power supply connection lines are connected to the corresponding power supply lines; the two sensing connection lines are connected to the sense lines;

a second electrode of a drive transistor of the second sub-pixel is connected to one of the power supply connection lines;

a second electrode of a drive transistor of the third sub-pixel is connected to another one of the power supply connection lines;

a second electrode of a sense transistor of the first sub-pixel is connected to one of the sensing connection lines through an active layer of the sense transistor; and a second electrode of a sense transistor of the fourth sub-pixel is connected to another one of the sensing connection lines through the active layer of the sense transistor.

9. The display substrate according to claim 8, wherein the buffer layer is further provided with a third via hole which exposes a sensing connection line; and a first conductive region of the sense transistor is connected to the sensing connection line through the third via hole.

10. The display substrate according to claim 7, further comprising gate insulating layers disposed between the gate electrodes of the plurality of transistors and the active layer of the plurality of transistors and an interlayer insulating layer disposed between the source and drain electrodes of the plurality of transistors and the active layer of the plurality of transistors;
   wherein an orthographic projection of the gate insulating layers on the base substrate coincides with an orthographic projection of the gate electrodes of the plurality of transistors on the base substrate.

11. The display substrate according to claim 10, wherein the interlayer insulating layer is provided with a via hole, the via hole is in the second non-light-emitting region, and the via hole simultaneously exposes the gate electrode of the drive transistor and the first electrode of the storage capacitor; the first electrode of the switch transistor is connected to the gate electrode of the drive transistor and the first electrode of the storage capacitor through the via hole.

12. The display substrate according to claim 2, wherein a manufacturing material of the first electrode of the storage capacitor is the same as a manufacturing material of a conductive region, and the conductive region comprises the first conductive region or the second conductive region; and
   the manufacturing material of the first electrode of the storage capacitor comprises transparent metal oxide, and a manufacturing material of the second electrode of the storage capacitor comprises a transparent conductive material.

13. The display substrate according to claim 1, wherein each sub-pixel is further provided with a light emitting element and a filter having a same color as the sub-pixel; the light emitting element comprises an anode, an organic light-emitting layer and a cathode which are sequentially disposed, wherein the anode is connected to the first electrode of the sense transistor, the anode is a transmission electrode and the cathode is a reflection electrode;
   an orthographic projection of the light emitting element on the base substrate coincides with the light-emitting region, and the filter is in the light-emitting region and disposed on a side of the light emitting element close to the base substrate; an orthographic projection of the anode on the base substrate covers an orthographic projection of the filter on the base substrate.

14. The display substrate according to claim 13, further comprising a passivation layer and a flat layer disposed on a side of the source and drain electrodes of the plurality of transistors away from the base substrate;
   the passivation layer is disposed on a side of the filter close to the base substrate, and the flat layer is disposed between the light emitting element and the filter; the passivation layer is provided with a fourth via hole exposing the first electrode of the sense transistor, and the flat layer is provided with a fifth via hole exposing the fourth via hole;
   the anode is connected to the first electrode of the sense transistor through the fourth via hole and the fifth via hole; and
   an orthographic projection of the fifth via hole on the base substrate does not completely coincide with an orthographic projection of the second via hole on the base substrate.

15. A display apparatus, comprising the display substrate according to claim 1.

16. A method for manufacturing a display substrate, which is used for manufacturing the display substrate according to claim 1, the method comprising:
   providing a base substrate; and
   forming a plurality of sub-pixels on the base substrate, wherein each sub-pixel comprises a light-emitting region and a non-light-emitting region, and a drive circuit is provided in each sub-pixel; the drive circuit comprises a storage capacitor and a plurality of transistors; the plurality of transistors comprise a switch transistor, a drive transistor and a sense transistor;
   for each sub-pixel, the plurality of transistors are in the non-light-emitting region, the storage capacitor is a transparent capacitor, and an orthographic projection of the storage capacitor on the base substrate coincides with the light-emitting region; a first electrode of the storage capacitor is disposed in a same layer as an active layer of the plurality of transistors and in a different layer from source and drain electrodes of the plurality of transistors, and a second electrode of the storage capacitor is on a side of the first electrode of the storage capacitor close to the base substrate;
   a first electrode of the drive transistor is connected to the second electrode of the storage capacitor through an active layer of the drive transistor, and a first electrode of the sense transistor is connected to the second electrode of the storage capacitor through an active layer of the sense transistor.

17. The method according to claim 16, wherein the display substrate further comprises a gate line, a data line, a power supply line and a sense line, wherein the gate line comprises a first gate line and a second gate line, and the step of forming the plurality of sub-pixels on the base substrate comprises:
   forming a light shield layer and the second electrode of the storage capacitor on the base substrate;
   forming the active layer of the plurality of transistors and the first electrode of the storage capacitor on the light shield layer and the second electrode of the storage capacitor;
   forming gate electrodes of the plurality of transistors, the first gate line and the second gate line on the active layer of the plurality of transistors and the first electrode of the storage capacitor;
   forming the data line, the power supply line, the sense line and the source and drain electrodes of the plurality of transistors on the gate electrodes of the plurality of transistors, the first gate line and the second gate line; and
   sequentially forming the filter and the light emitting element on the data line, the power supply line, the sense line and the source and drain electrodes of the plurality of transistors.

18. The method according to claim 17, wherein the step of forming the light shield layer and the second electrode of the storage capacitor on the base substrate comprises:
   sequentially forming the light shield layer and the second electrode of the storage capacitor on the base substrate, or sequentially forming the second electrode of the storage capacitor and the light shield layer on the base substrate, or simultaneously forming the second electrode of the storage capacitor and the light shield layer on the base substrate.

19. The method according to claim 18, wherein the step of simultaneously forming the second electrode of the storage capacitor and the light shield layer on the base substrate comprises:
   sequentially depositing a light shielding thin film and a transparent conductive thin film on the base substrate; and
   simultaneously forming the second electrode of the storage capacitor and the light shield layer using a halftone mask.

20. The method according to claim 17, wherein the step of forming the active layer of the plurality of transistors and the first electrode of the storage capacitor on the light shield layer and the second electrode of the storage capacitor comprises:
- forming a buffer layer comprising a first via hole, a second via hole and a third via hole on the light shield layer and the second electrode of the storage capacitor; the first via hole and the second via hole exposing the second electrode of the storage capacitor, and the third via hole exposing a sensing connection line; and
- forming the active layer of the plurality of transistors and the first electrode of the storage capacitor on the buffer layer using a same manufacturing process;
- the step of sequentially forming the filter and the light emitting element on the data line, the power supply line, the sense line and the source and drain electrodes of the plurality of transistors comprises:
- forming a passivation layer comprising a fourth via hole on the data line, the power supply line, the sense line and the source and drain electrodes of the plurality of transistors; the fourth via hole exposing the first electrode of the sense transistor;
- sequentially forming the filter and a flat layer comprising a fifth via hole on the passivation layer; the fifth via hole exposing a seventh via hole; and
- forming the light emitting element on the flat layer.

* * * * *